(12) United States Patent
Kusunoki et al.

(10) Patent No.: US 11,054,710 B2
(45) Date of Patent: Jul. 6, 2021

(54) DISPLAY DEVICE AND ELECTRONIC DEVICE

(71) Applicant: Semiconductor Energy Laboratory Co., Ltd., Atsugi (JP)

(72) Inventors: Koji Kusunoki, Isehara (JP); Kazunori Watanabe, Machida (JP); Susumu Kawashima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/631,511

(22) PCT Filed: Jul. 26, 2018

(86) PCT No.: PCT/IB2018/055582
§ 371 (c)(1),
(2) Date: Jan. 16, 2020

(87) PCT Pub. No.: WO2019/030595
PCT Pub. Date: Feb. 14, 2019

(65) Prior Publication Data
US 2020/0142229 A1 May 7, 2020

(30) Foreign Application Priority Data
Aug. 11, 2017 (JP) .............................. JP2017-156237

(51) Int. Cl.
*G02F 1/1368* (2006.01)
*G02F 1/1362* (2006.01)
*H01L 27/32* (2006.01)

(52) U.S. Cl.
CPC ...... *G02F 1/1368* (2013.01); *G02F 1/136286* (2013.01); *H01L 27/3262* (2013.01)

(58) Field of Classification Search
CPC ............. G02F 1/1368; G02F 1/136286; H01L 27/1225; H01L 27/3262; H01L 27/1255
See application file for complete search history.

(56) References Cited

U.S. PATENT DOCUMENTS 7,674,650 B2   3/2010   Akimoto et al.
8,421,716 B2   4/2013   Numao
(Continued)

FOREIGN PATENT DOCUMENTS

CN   101460989 A   6/2009
CN   103035189 A   4/2013
(Continued)

OTHER PUBLICATIONS

International Search Report (Application No. PCT/IB2018/055582) dated Nov. 20, 2018.
(Continued)

*Primary Examiner* — Jia X Pan
(74) *Attorney, Agent, or Firm* — Robinson Intellectual Property Law Office; Eric J. Robinson

(57) ABSTRACT

A display device capable of performing image processing is provided.
Each pixel is provided with a memory circuit, and desired correction data is held in the memory circuit. The correction data is calculated in an external device and written into each pixel. The correction data is added to image data owing to capacitive coupling, and the resulting data is supplied to a display element. Thus, a corrected image can be displayed with the display element. The correction enables image upconversion or can compensate for an image quality reduction due to characteristics variations of transistors included in pixels.

19 Claims, 17 Drawing Sheets

(56) References Cited

U.S. PATENT DOCUMENTS

| | | |
|---|---|---|
| 8,860,108 B2 | 10/2014 | Yamazaki et al. |
| 10,140,940 B2 | 11/2018 | Aoki |
| 2009/0141204 A1 | 6/2009 | Numao |
| 2013/0082906 A1* | 4/2013 | Toyomura ............ G09G 3/2014 345/55 |
| 2016/0064424 A1* | 3/2016 | Umezaki ............ H01L 27/1225 257/43 |

FOREIGN PATENT DOCUMENTS

| | | | |
|---|---|---|---|
| JP | 2007-096055 A | | 4/2007 |
| JP | 2007-123861 A | | 5/2007 |
| JP | 2011-119674 A | | 6/2011 |
| JP | 2013-076812 A | | 4/2013 |
| JP | 2017-027012 A | | 2/2017 |
| JP | 2019-045613 A | | 3/2019 |
| JP | 2019-045614 A | | 3/2019 |
| KR | 20050096669 A | * | 10/2005 |
| KR | 10-1043673 | | 6/2011 |
| WO | WO-2008/026350 | | 3/2008 |
| WO | WO-2019/043483 | | 3/2019 |

OTHER PUBLICATIONS

Written Opinion (Application No. PCT/IB2018/055582) dated Nov. 20, 2018.
Fukunaga.Y et al., "Low Power, High Image Quality Color Reflective LCDs Realized by Memory-in-Pixel Technology and Optical Optimization Using Newly-Developed Scattering Layer", SID Digest '13: SID International Symposium Digest of Technical Papers, 2011, pp. 701-704.

* cited by examiner

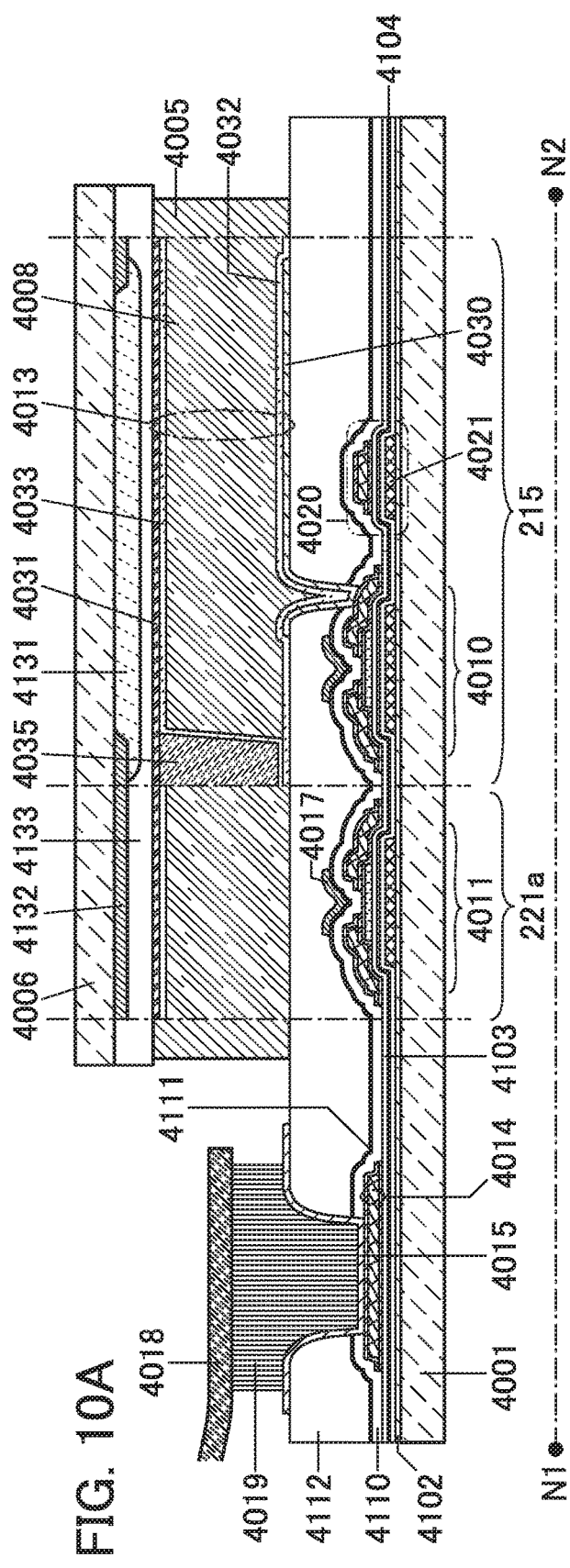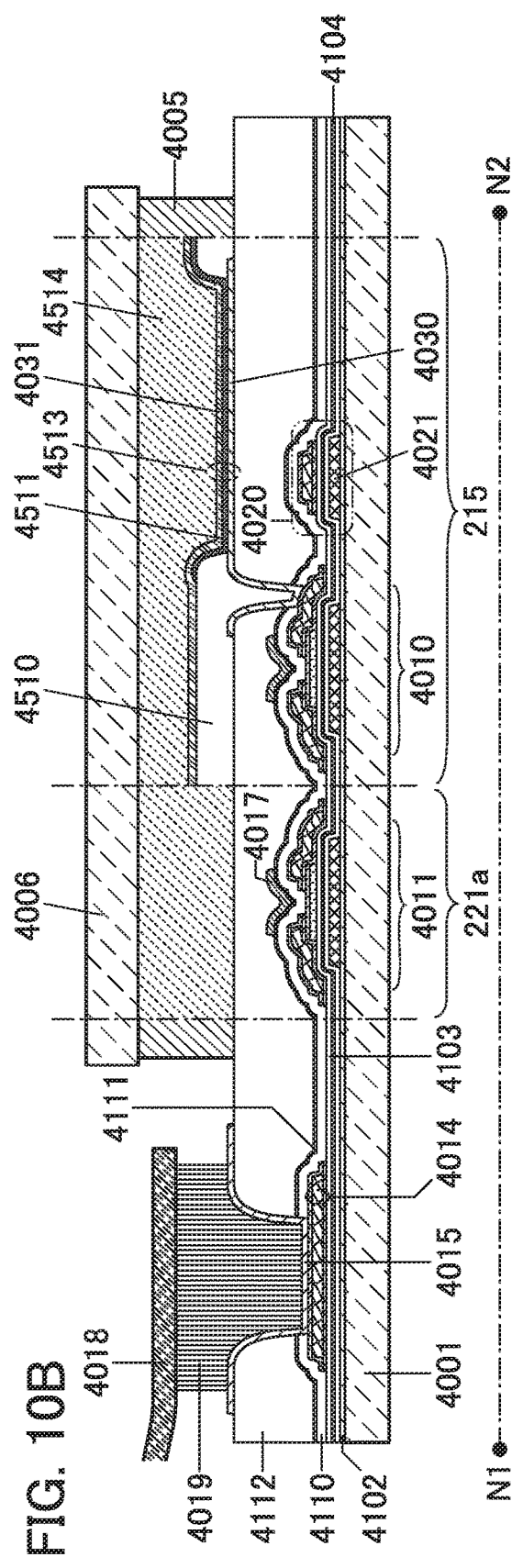

$a = x_1 w_1 + x_2 w_2 + b$

DISPLAY DEVICE AND ELECTRONIC DEVICE

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device generally means a device that can function by utilizing semiconductor characteristics. A transistor and a semiconductor circuit are embodiments of a semiconductor device. A memory device, a display device, an imaging device, or an electronic device sometimes includes a semiconductor device.

BACKGROUND ART

A technique for fabricating a transistor with the use of a metal oxide formed over a substrate has attracted attention. For example, Patent Document 1 and Patent Document 2 each disclose a technique in which a transistor containing zinc oxide or In—Ga—Zn-based oxide is used as a switching element or the like of a pixel in a display device.

Patent Document 3 discloses a memory device having a structure in which a transistor with an extremely low off-state current is used in a memory cell.

REFERENCES

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

With the increase in resolution of display devices, hardware capable of performing display with 8K4K (pixel count: 7680×4320) resolution or higher has been developed. Meanwhile, the amount of data for high-resolution images is enormous; thus, peripheral technologies such as an imaging device, a memory device, and a communication device need to be developed as well in order that high-resolution display devices can be widely used.

One technique for generating high-resolution image data is upconversion. With upconversion, a low-resolution image can be converted into a pseudo high-resolution image. Upconversion is performed in a peripheral device of a display device; hence, a conventional technique can be utilized for a device that processes image data before upconversion.

However, a device that performs upconversion analyzes an enormous amount of image data and generates new image data; thus, there are problems of increases in circuit scale and power consumption. Moreover, the amount of processing is sometimes too much to handle in real time, causing a display delay.

Although upconversion has such problems, the problems of power consumption, delay, and the like are possibly alleviated, for example, when functions related to upconversion are distributed among a plurality of devices.

In a display device including an EL element or the like, variations in characteristics of transistors included in pixels become a factor in decreasing display quality. Methods for correcting variations in transistor characteristics are internal correction in which image data is corrected with a circuit included in a pixel, and external correction in which data for correction per pixel is obtained, correction data is generated, and then image data to which the correction data is added is supplied to each pixel.

Although internal correction can be performed frame by frame, a shorter horizontal selection period in a higher-resolution display device makes it difficult to take a sufficient correction period. External correction is effective in a high-resolution display device but puts a large load on an external device because all image data needs to be corrected. Ideally, operation without correction is preferable; however, it is extremely difficult to reduce variations in transistor characteristics, leading to a demand for a novel correction method.

Thus, an object of one embodiment of the present invention is to provide a display device capable of performing image processing. Another object is to provide a display device capable of performing upconversion operation. Another object is to provide a display device capable of correcting image data.

Another object is to provide a display device with low power consumption. Another object is to provide a display device with high reliability. Another object is to provide a novel display device or the like. Another object is to provide a method for driving the above display device. Another object is to provide a novel semiconductor device or the like.

Note that the description of these objects does not disturb the existence of other objects. One embodiment of the present invention does not need to achieve all of these objects. Other objects will be apparent from the description of the specification, the drawings, the claims, and the like, and other objects can be derived from the description of the specification, the drawings, the claims, and the like.

Means for Solving the Problems

One embodiment of the present invention relates to a display device capable of performing image processing. Another embodiment of the present invention relates to a display device capable of correcting an image signal.

One embodiment of the present invention is a display device including a first transistor, a second transistor, a third transistor, a fourth transistor, a first capacitor, a second capacitor, and a display element, one of a source and a drain of the first transistor is electrically connected to one electrode of the first capacitor, the one electrode of the first capacitor is electrically connected to the display element, one of a source and a drain of the second transistor is electrically connected to the other electrode of the first capacitor, the other electrode of the first capacitor is electrically connected to one of a source and a drain of the third transistor, a gate of the third transistor is electrically connected to one of a source and a drain of the fourth transistor, and the one of the source and the drain of the fourth transistor is electrically connected to one electrode of the second capacitor.

It is preferable that at least the fourth transistor include a metal oxide in a channel formation region and the metal oxide include In, Zn, and M (M is Al, Ti, Ga, Sn, Y, Zr, La, Ce, Nd, or Hf).

It is preferable that the other of the source and the drain of the second transistor be electrically connected to a low potential power supply line and the other of the source and the drain of the third transistor be electrically connected to a high potential power supply line.

A fifth transistor and a sixth transistor may be further included, one of a source and a drain of the fifth transistor may be electrically connected to the one of the source and the drain of the first transistor, the other of the source and the drain of the fifth transistor may be electrically connected to the display element, one of a source and a drain of the sixth transistor may be electrically connected to the other of the source and the drain of the fifth transistor, and the other of the source and the drain of the sixth transistor may be electrically connected to a low potential power supply line.

The display element may be a liquid crystal element, a third capacitor may be further included, one electrode of the liquid crystal element may be electrically connected to one electrode of the third capacitor, and the one electrode of the third capacitor may be electrically connected to the one of the source and the drain of the first transistor.

The display element may be an organic EL element, a fourth capacitor and a seventh transistor may be further included, one electrode of the organic EL element may be electrically connected to one electrode of the fourth capacitor, the one electrode of the fourth capacitor may be electrically connected to one of a source and a drain of the seventh transistor, a gate of the seventh transistor may be electrically connected to the other of the source and the drain of the fifth transistor, and the other of the source and the drain of the fifth transistor may be electrically connected to the other electrode of the fourth capacitor. An eighth transistor and a first circuit may be further included, the first circuit may have a function of reading a current value and a function of generating correction data, one of a source and a drain of the eighth transistor may be electrically connected to the one of the source and the drain of the seventh transistor, and the other of the source and the drain of the eighth transistor may be electrically connected to the first circuit.

Effect of the Invention

With one embodiment of the present invention, a display device capable of performing image processing can be provided. A display device capable of performing upconversion operation can be provided. A display device capable of correcting image data can be provided.

A display device with low power consumption can be provided. A display device with high reliability can be provided. A novel display device or the like can be provided. A method for driving the above display device can be provided. A novel semiconductor device or the like can be provided.

BRIEF DESCRIPTION OF DRAWINGS

FIG. 10 Diagrams showing a display device.

MODE FOR CARRYING OUT THE INVENTION

Figure 1:
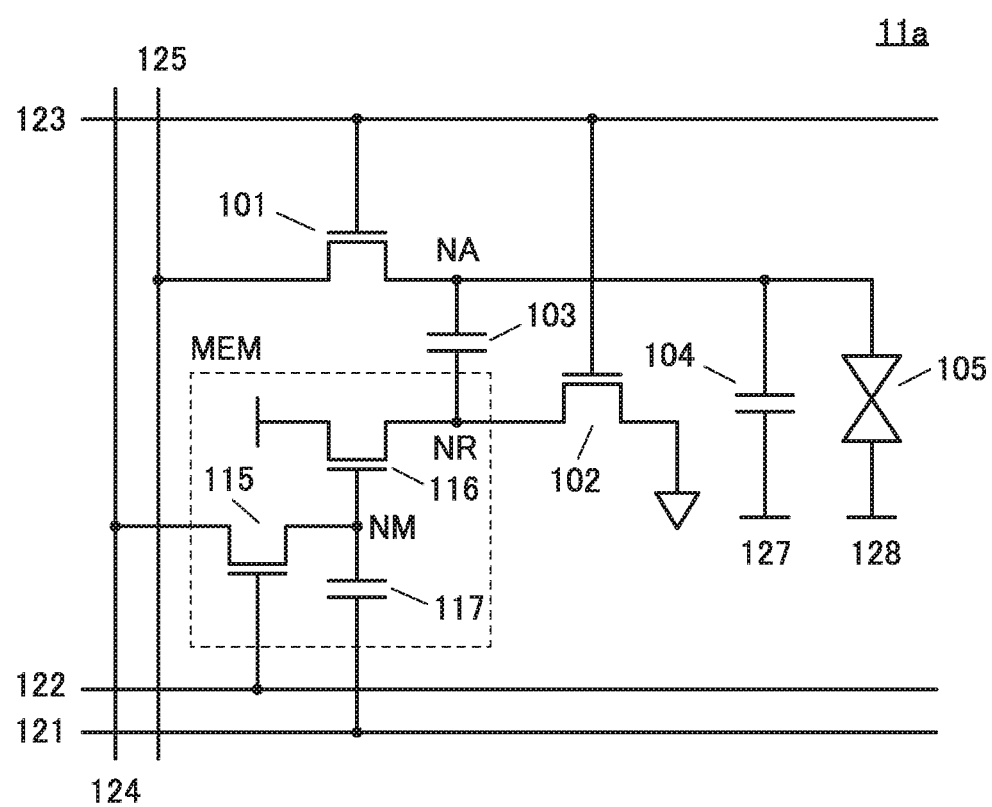
FIG. 1 A diagram showing a pixel circuit.

Embodiments will be described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the description of embodiments below. Note that in structures of the invention described below, the same reference numerals are used, in different drawings, for the same portions or portions having similar functions, and description thereof is not repeated in some cases. Note that the hatching of the same element that constitutes a drawing is omitted or changed as appropriate in different drawings in some cases.

Embodiment 1

In this embodiment, a display device of one embodiment of the present invention is described with reference to the drawings.

One embodiment of the present invention is a display device having a function of adding correction data to image data. Each pixel is provided with a memory circuit, and desired correction data is held in the memory circuit. The correction data is generated in an external device and written into each pixel.

The correction data is added to image data owing to capacitive coupling, and the resulting data is supplied to a display element. Thus, a corrected image can be displayed with the display element. The correction enables image upconversion or can compensate for an image quality reduction due to characteristics variations of transistors included in pixels.

FIG. 1 is a diagram showing a pixel 11a that can be used for a display device of one embodiment of the present invention. The pixel 11a includes a transistor 101, a transistor 102, a transistor 115, a transistor 116, a capacitor 103, a capacitor 104, a capacitor 117, and a liquid crystal element 105.

One of a source and a drain of the transistor 101 is electrically connected to one electrode of the capacitor 103. The one electrode of the capacitor 103 is electrically connected to one electrode of the capacitor 104. The one electrode of the capacitor 104 is electrically connected to the liquid crystal element 105. One of a source and a drain of the transistor 102 is electrically connected to the other electrode of the capacitor 103. The other electrode of the capacitor 103 is electrically connected to one of a source and a drain of the transistor 116. A gate of the transistor 116 is electrically connected to one of a source and a drain of the transistor 115. The one of the source and the drain of the transistor 115 is electrically connected to one electrode of the capacitor 117.

Here, a wiring to which the one of the source and the drain of the transistor 101, the one electrode of the capacitor 103, the one electrode of the capacitor 104, and one electrode of the liquid crystal element 105 are connected is referred to as a node NA. A wiring to which the other electrode of the capacitor 103, the one of the source and the drain of the transistor 102, and the one of the source and the drain of the transistor 116 are connected is referred to as a node NR. A wiring to which the gate of the transistor 116, the one of the source and the drain of the transistor 115, and the one electrode of the capacitor 117 are connected is referred to as a node NM.

A gate of the transistor 101 is electrically connected to a wiring 123. A gate of the transistor 102 is electrically connected to the wiring 123. The other electrode of the capacitor 117 is electrically connected to a wiring 121. A gate of the transistor 115 is electrically connected to a wiring 122. The other of the source and the drain of the transistor 115 is electrically connected to a wiring 124.

The other of the source and the drain of the transistor 116 is electrically connected to a power supply line (at a high potential). The other of the source and the drain of the transistor 102 is electrically connected to a power supply line (at a low potential). The other electrode of the capacitor 104 is electrically connected to a common wiring 127. The other electrode of the liquid crystal element 105 is electrically connected to a common wiring 128. Note that a given potential can be supplied to the common wirings 127 and 128, and they may be electrically connected to each other.

The wirings 122 and 123 can each have a function of a signal line for controlling the operation of the transistors. A wiring 125 can have a function of a signal line for supplying image data. The wiring 121 and the wiring 124 can each have a function of a signal line for operating a memory circuit MEM described next.

The transistor 115, the transistor 116, and the capacitor 117 form the memory circuit MEM. The node NM is a memory node; when the transistor 115 is turned on, data supplied to the wiring 124 can be written into the node NM. The use of a transistor with an extremely low off-state current as the transistor 115 enables the potential of the node NM to be held for a long time. As the transistor, a transistor using a metal oxide in its channel formation region (hereinafter, an OS transistor) can be used, for example.

Note that an OS transistor may be used as other transistors included in the pixel as well as the transistor 115. A transistor containing Si in its channel formation region (hereinafter, a Si transistor) may also be used as the transistor 115. Both an OS transistor and a Si transistor may be used as the transistors included in the pixel. Examples of the Si transistor include a transistor containing amorphous silicon and a transistor containing crystalline silicon (typically, low-temperature polysilicon or single crystal silicon).

When a reflective liquid crystal element or an EL (Electro Luminescence) element is used as the display element, a silicon substrate can be used; thus, a Si transistor and an OS transistor can be formed to have a region overlapping with each other. Thus, the pixel density can be increased even when the number of transistors is relatively large.

As a semiconductor material used for an OS transistor, a metal oxide with an energy gap of 2 eV or more, preferably 2.5 eV or more, further preferably 3 eV or more can be used. A typical example thereof is an oxide semiconductor containing indium, and a CAAC-OS or a CAC-OS described later can be used, for example. A CAAC-OS is suitable for a transistor that emphasizes the reliability, for example, because of the stability of atoms composing crystals therein. A CAC-OS exhibits excellent mobility characteristics and thus is suitable for a transistor that operates at high speed, for example.

An OS transistor has a large energy gap and thus exhibits extremely low off-state current characteristics. An OS transistor has the following feature different from that of a Si transistor: impact ionization, an avalanche breakdown, a short-channel effect, or the like does not occur and thus can configure a highly reliable circuit.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor included in the semiconductor layer is an In-M-Zn-based oxide, it is preferable that the atomic ratio of metal elements of a sputtering target used to deposit the In-M-Zn oxide satisfy In≥M and Zn≥M. The atomic ratio of the metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratios of the metal elements of the sputtering target in a range of ±40%.

An oxide semiconductor with a low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and thus can be regarded as an oxide semiconductor having stable characteristics.

Note that the composition is not limited to the above, and a material with an appropriate composition may be used depending on required semiconductor characteristics and electrical characteristics (field-effect mobility, threshold voltage, and the like) of a transistor. In order that the required semiconductor characteristics of the transistor can be obtained, it is preferable that the carrier density, the impurity concentration, the defect density, the atomic ratio of a metal element to oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type.

Thus, the concentration of silicon or carbon (concentration measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal sometimes generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor that contains nitrogen is likely to have normally-on characteristics. Hence, the concentration of nitrogen (concentration measured by secondary ion mass spectrometry) in the semiconductor layer is preferably set to lower than or equal to $5\times10^{18}$ atoms/cm$^3$.

The semiconductor layer may have a non-single-crystal structure, for example. Examples of the non-single-crystal structure include a CAAC-OS including a c-axis aligned crystal (C-Axis Aligned Crystalline Oxide Semiconductor or C-Axis Aligned and A-B-plane Anchored Crystalline Oxide Semiconductor), a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements included in an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. In particular, indium and zinc are preferably contained. In addition to them, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)) and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)), for example, so that a mosaic pattern is formed, and mosaic-like InO$_{X1}$ or In$_{X2}$Zn$_{Y2}$O$_{Z2}$ is evenly distributed in the film (which is hereinafter also referred to as cloud-like).

That is, the CAC-OS is a composite oxide semiconductor having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

Meanwhile, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where GaO$_{X3}$ is a main component and the region where In$_{X2}$Zn$_{Y2}$O$_{Z2}$ or InO$_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS has an nc (nano-crystal) structure with no alignment in the plane direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

By contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

Moreover, a semiconductor element using the CAC-OS has high reliability. Thus, the CAC-OS is suitable as a constituent material in a variety of semiconductor devices.

In the pixel 11a, data written into the node NM can be read out to the node NR when an appropriate potential is supplied to the wiring 121. The potential can be, for example, a potential corresponding to the threshold voltage of the transistor 116. In the case where image data has been written into the node NA before this operation, a data potential obtained by adding the potential of the node NR to the image data is applied to the liquid crystal element 105 owing to capacitive coupling of the capacitor 103.

In other words, when desired correction data is stored in the node NM in advance, the correction data can be added to the supplied image data. Note that the correction data is sometimes attenuated by a component on the transmission path and thus is preferably generated in consideration of the attenuation.

Figure 2:
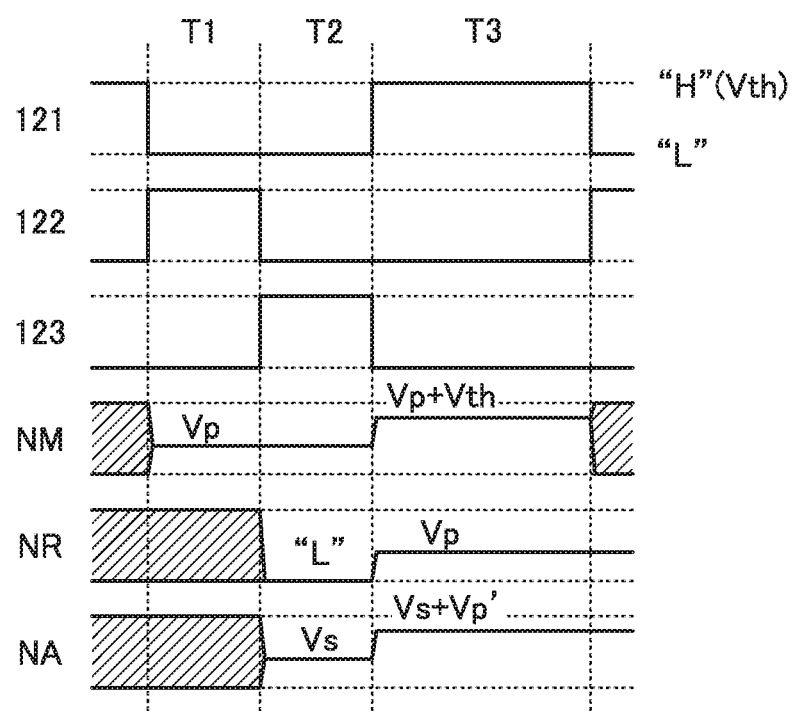
FIG. 2 A timing chart showing operation of a pixel circuit.

The details of the operation of the pixel 11a are described with reference to a timing chart shown in FIG. 2. At a desired timing, correction data (Vp) is supplied to the wiring 124 and image data (Vs) is supplied to the wiring 125. In the following description, "H" represents a high potential and "L" represents a low potential.

In Period T1, the potential of the wiring 121 is set to "L", the potential of the wiring 122 is set to "H", and the potential of the wiring 123 is set to "L", so that the transistor 115 is turned on and the correction data (Vp) is written into the node NM.

In Period T2, the potential of the wiring 121 is set to "L", the potential of the wiring 122 is set to "L", and the potential of the wiring 123 is set to "H", so that the transistor 102 is turned on and the node NR is reset to "L". In addition, the transistor 101 is turned on and the image data (Vs) is written into the node NA.

In Period T3, the potential of the wiring 121 is set to "H", the potential of the wiring 122 is set to "L", and the potential of the wiring 123 is set to "L", so that the potential of the wiring 121 is added to the potential of the node NM owing to capacitive coupling of the capacitor 117. In that case, the potential of the wiring 121 is set to the threshold voltage (Vth) of the transistor 116, so that the potential of the node NM becomes Vp+Vth. Then, the transistor 116 is turned on, and the potential of the node NR becomes a potential that is lower than the gate potential of the transistor 116 by the threshold voltage (Vth), that is, a potential corresponding to the correction data (Vp).

Owing to the capacitive coupling of the capacitor 103, a potential (Vp') corresponding to the capacitance ratio of the node NR to the node NA is added to the image data (Vs). That is, the potential of the node NA becomes Vs+Vp'.

In this manner, a potential derived from correction data can be added to image data, which enables display to be corrected.

The configuration and operation of the pixel 11a described above are effective in upconverting images. Upconversion using the pixel 11a is described with reference to FIGS. 3(A) and 3(B).

For example, the pixel count of an 8K4K display device is four times the pixel count of a 4K2K display device (3840×2160). That is, when image data that is displayed by one pixel of a 4K2K display device is to be simply displayed on an 8K4K display device, the same image data is displayed by four pixels.

Figure 3A:
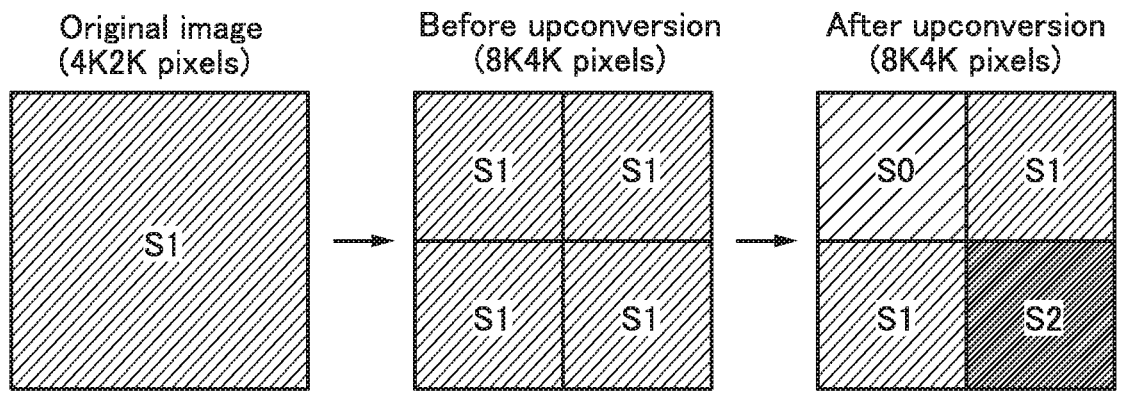
FIG. 3 Diagrams showing upconversion.

FIG. 3(A) is a diagram showing an image displayed by four pixels in the horizontal and vertical directions and assuming the above condition. As shown in FIG. 3(A), image data S1 is displayed by all the four pixels before upconversion, whereas image data S0 to S2 are applied to the corresponding pixels after upconversion, resulting in an increase in resolution.

Figure 3B:
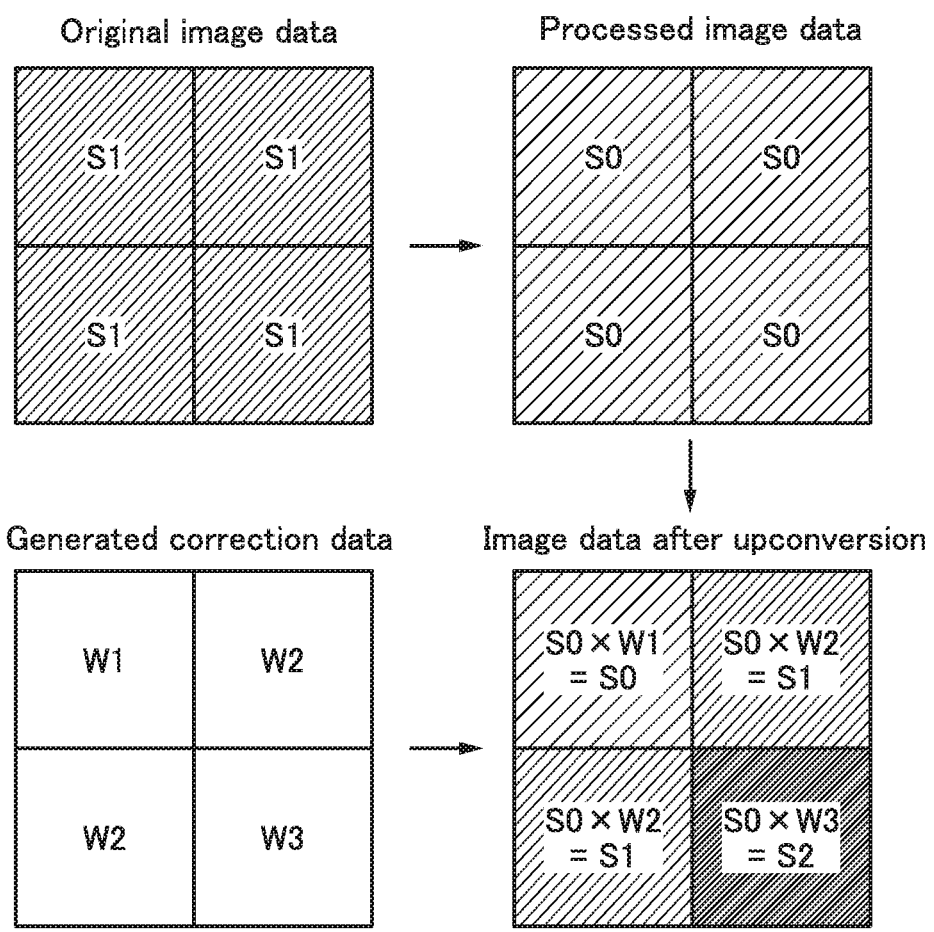

FIG. 3(B) is a diagram showing the upconversion operation in the pixel 11a. In the pixel 11a, the image data is corrected by the above-described method; thus, the image data correction is performed in the direction in which the potential increases. Hence, the original image data S1 is processed into the image data S0 with a low data potential by an external device, which is then supplied to the pixel 11a. Note that the generation operation of the image data S0 is simple; thus, the load on the external device is small.

Moreover, correction data W1 to W3 are supplied to the pixels. Here, there is no particular limitation on a method for generating W1 to W3. The correction data may be generated in real time using an external device, or correction data stored in a memory medium may be read out and synchronized with the image data S0.

Then, the aforementioned operation of the pixel 11a is performed, whereby each correction data is added to the image data and thus the new image data S0 to S2 are generated. Consequently, an upconverted image can be displayed.

In conventional upconversion with external correction, a heavy load is put on an external device because new image data itself is generated. By contrast, in one embodiment of the present invention described above, image data to be supplied is not largely changed, and new image data is generated in a pixel supplied with correction data; thus, the load on an external device can be small. Moreover, the operation for generating new image data in a pixel can be executed with a small number of steps; hence, one embodiment of the present invention is applicable even to a display device that has a large number of pixels and a short horizontal period.

Figure 4A:
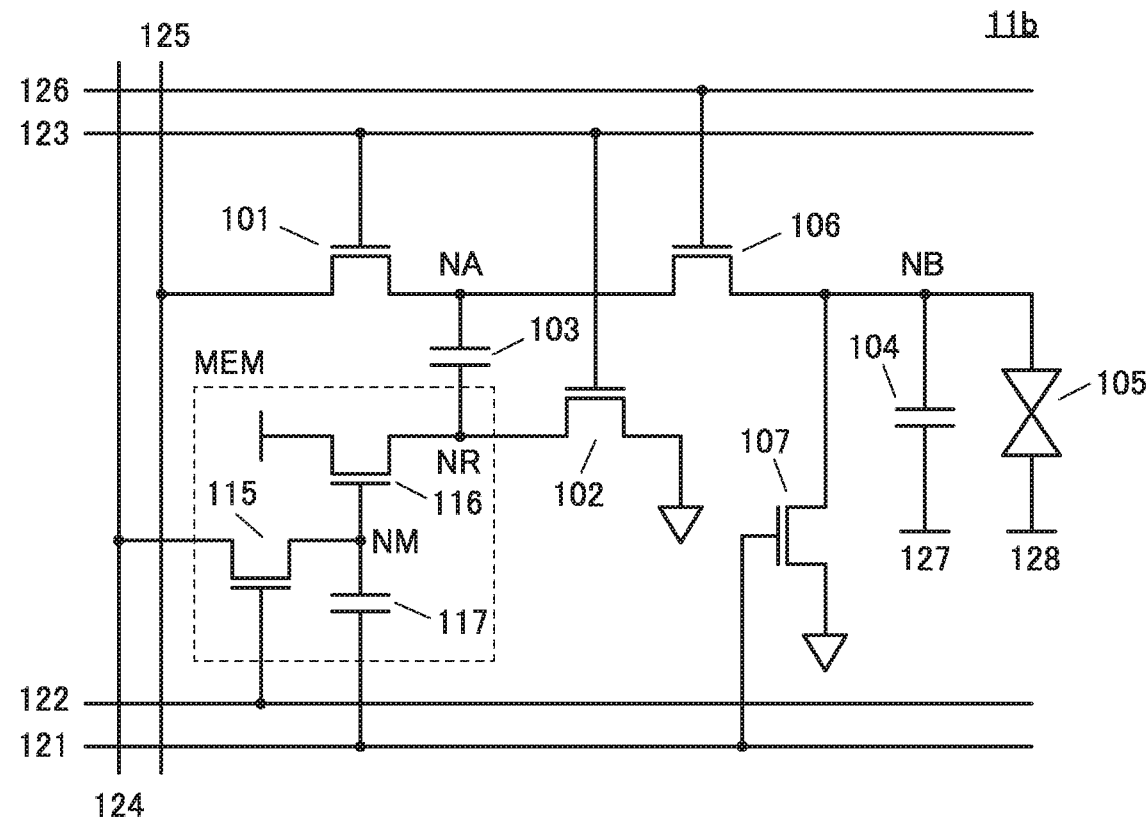
FIG. 4 Diagrams showing pixel circuits.

The pixel of one embodiment of the present invention can also have a configuration of a pixel 11b shown in FIG. 4(A). The pixel 11b has a configuration in which a transistor 106, a transistor 107, and a wiring 126 are added to the pixel 11a.

One of a source and a drain of the transistor 106 is electrically connected to the one of the source and the drain of the transistor 101. The other of the source and the drain of the transistor 106 is electrically connected to the one electrode of the liquid crystal element 105. One of a source and a drain of the transistor 107 is electrically connected to the other of the source and the drain of the transistor 106, and the other of the source and the drain of the transistor 107 is electrically connected to a power supply line (at a low potential).

In the above configuration, a wiring to which the one of the source and the drain of the transistor 101, the one electrode of the capacitor 103, and the one of the source and the drain of the transistor 106 are connected is referred to as the node NA. A wiring to which the other of the source and the drain of the transistor 106, the one electrode of the capacitor 104, and the one electrode of the liquid crystal element 105 are connected is referred to as a node NB.

A gate of the transistor 106 is electrically connected to the wiring 126. A gate of the transistor 107 is electrically connected to the wiring 121. The wiring 126 can have a function of a signal line for controlling the operation of the transistor.

In the configuration of the pixel 11a, the image data is input and then the operation for adding the correction data is performed; thus, the liquid crystal element 105 sometimes operates in a stepwise manner. Hence, the operation of the liquid crystal element 105 is recognized depending on its response characteristics, which sometimes decreases the display quality.

In the pixel 11b, the image data is supplied to the node NA and the correction data is added while the transistor 106 is turned off. After that, the transistor 106 is turned on, so that the corrected image data is supplied to the node NB. Thus, the liquid crystal element 105 does not operate in a stepwise manner, inhibiting a decrease in the display quality.

Figure 5:
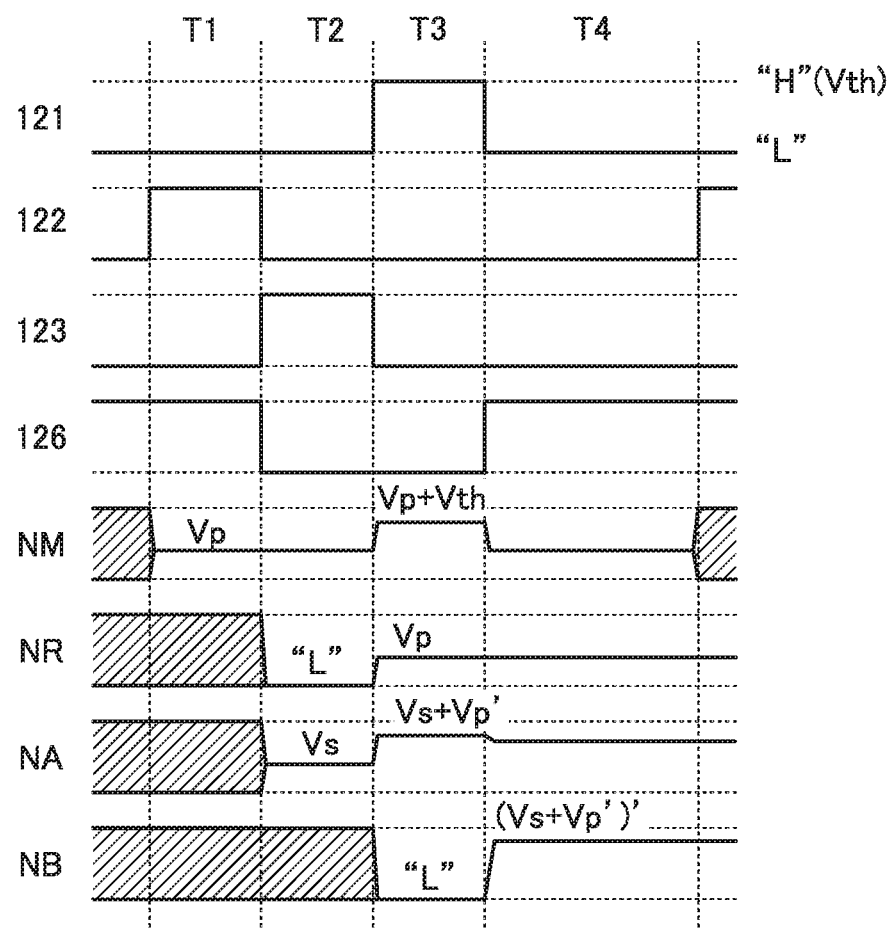
FIG. 5 A timing chart showing operation of a pixel circuit.

The details of the operation of the pixel 11b are described with reference to a timing chart shown in FIG. 5. At an appropriate timing, the correction data (Vp) is supplied to the wiring 124 and the image data (Vs) is supplied to the wiring 125. In the following description, "H" represents a high potential and "L" represents a low potential.

In Period T1, the potential of the wiring 121 is set to "L", the potential of the wiring 122 is set to "H", and the potential of the wiring 123 is set to "L", so that the transistor 115 is turned on and the correction data (Vp) is written into the node NM. Note that the potential of the wiring 126 remains at "H" in Period T1 continuously from the operation of the previous frame.

In Period T2, the potential of the wiring 121 is set to "L", the potential of the wiring 122 is set to "L", the potential of the wiring 123 is set to "H", and the potential of the wiring 126 is set to "L", so that the transistor 102 is turned on and the node NR is reset to "L". In addition, the transistor 101 is turned on and the image data (Vs) is written into the node NA. Moreover, the transistor 106 is turned off, so that the potential of the node NB is continuously held and display continues.

In Period T3, the potential of the wiring 121 is set to "H", the potential of the wiring 122 is set to "L", the potential of the wiring 123 is set to "L", and the potential of the wiring 126 is set to "L", so that the potential of the wiring 121 is added to the potential of the node NM owing to the capacitive coupling of the capacitor 117. In that case, the potential of the wiring 121 is set to the threshold voltage (Vth) of the transistor 116, so that the potential of the node NM becomes Vp+Vth. Then, the transistor 116 is turned on, and the potential of the node NR becomes a potential that is lower than the gate potential of the transistor 116 by the threshold voltage (Vth), that is, a potential corresponding to the correction data (Vp).

Owing to the capacitive coupling of the capacitor 103, a potential (Vp') corresponding to the capacitance ratio of the node NR to the node NA is added to the image data (Vs). That is, the potential of the node NA becomes Vs+Vp'. The transistor 107 is turned on, so that the potential of the node NB is reset to "L".

In Period T4, the potential of the wiring 121 is set to "L", the potential of the wiring 122 is set to "L", the potential of the wiring 123 is set to "L", and the potential of the wiring 126 is set to "H", so that the potential of the node NA is distributed to the node NB and the potential of the node NB becomes (Vs+Vp')'.

In this manner, a potential derived from correction data can be added to image data, which enables display to be corrected.

Figure 4B:
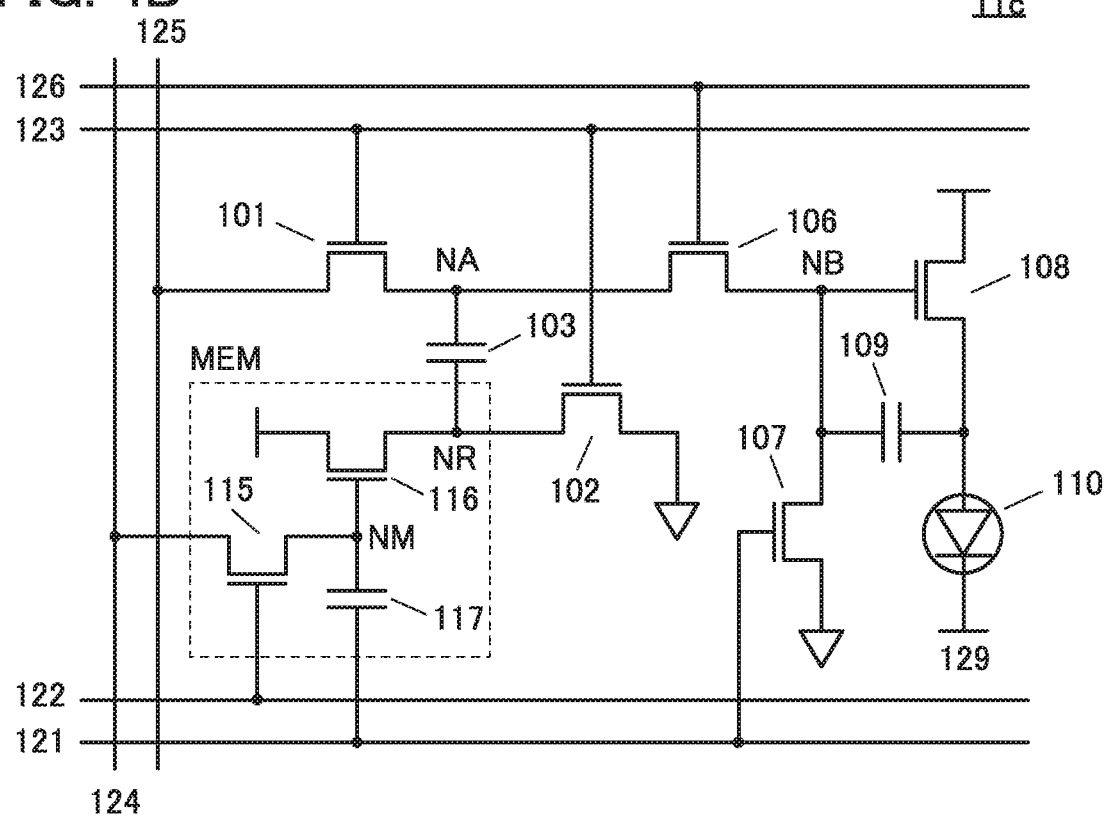

Note that another display element may be operated using the basic configuration of the pixel 11b. FIG. 4(B) is a diagram showing the configuration of a pixel 11c that includes an EL element 110, a transistor 108, and a capacitor 109 instead of the liquid crystal element 105 and the capacitor 104 in the pixel 11b.

One electrode of the EL element 110 is electrically connected to one electrode of the capacitor 109. The one electrode of the capacitor 109 is electrically connected to one of a source and a drain of the transistor 108. A gate of the transistor 108 is electrically connected to the other of the source and the drain of the transistor 106. The other of the source and the drain of the transistor 106 is electrically connected to the other electrode of the capacitor 109.

In the above configuration, a wiring to which the other of the source and the drain of the transistor 106, the other electrode of the capacitor 109, and the gate of the transistor 108 are connected is referred to as the node NB.

The other of the source and the drain of the transistor 108 is electrically connected to a power supply line (at a high potential). The other electrode of the EL element 110 is electrically connected to a common wiring 129. A given potential can be supplied to the common wiring 129.

For the operation of the pixel 11c, refer to the description of the operation of the pixel 11b described above.

Figure 6:
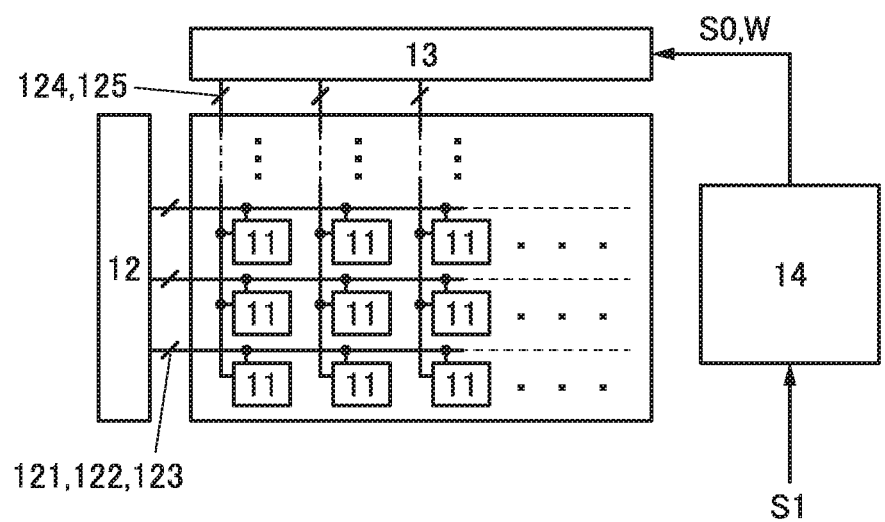
FIG. 6 A block diagram showing a display device.

FIG. 6 is an example of a block diagram of a display device of one embodiment of the present invention. The display device includes a pixel array where pixels 11 are arranged in a matrix, a row driver 12, a column driver 13, and a circuit 14. Any of the pixels 11a to 11c described above can be used as the pixels 11.

For the row driver 12 and the column driver 13, a shift register circuit can be used, for example. The circuit 14 has a function of generating image data and correction data. Note that the circuit 14 can also be referred to as an external device that generates the correction data.

The image data S1 described with reference to FIGS. 3(A) and 3(B) is input to the circuit 14, and the image data S0 and the correction data W are generated and output to the column driver 13. Note that different circuits may have a function of generating the image data S0 and a function of generating the correction data W.

The circuit 14 may include a neural network. With the use of a deep neural network that has learned an enormous number of images as teacher data, for example, the correction data W with high accuracy can be generated.

Although the upconversion operation in a pixel including the memory circuit MEM is mainly described above, operation for correcting variations in transistor characteristics can also be performed in the pixel. In the pixel using an EL element, variations in the threshold voltage of a driving transistor that supplies current to the EL element significantly affect the display quality. Data for correcting the threshold voltage of the driving transistor is held in the memory circuit MEM and added to image data, so that the display quality can be improved.

Figure 7:
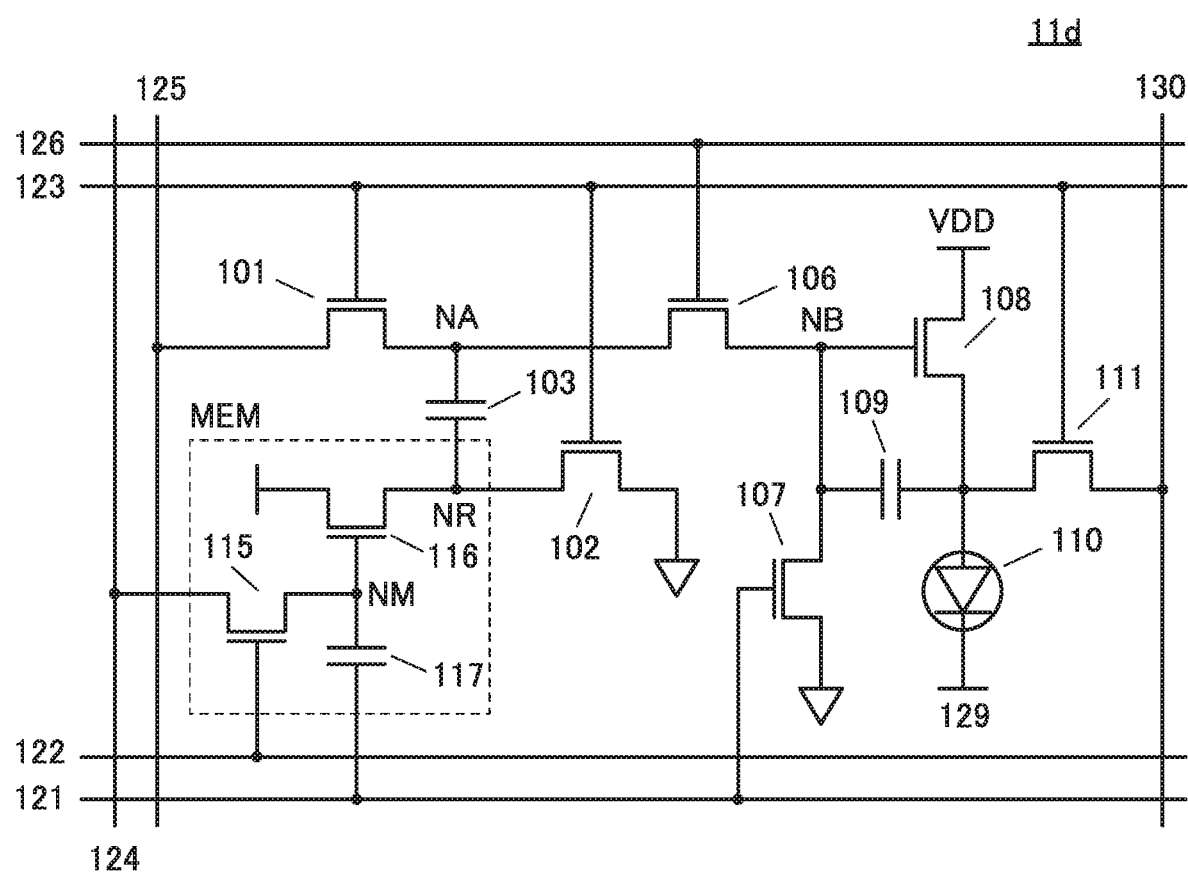
FIG. 7 A diagram showing a pixel circuit.

FIG. 7 is a diagram showing the configuration of a pixel 11d that can perform operation for correcting the threshold voltage (Vth) of the transistor 108 corresponding to the driving transistor. The pixel 11d has a configuration in which a transistor 111 and a wiring 130 are added to the pixel 11c.

One of a source and a drain of the transistor 111 is electrically connected to the one of the source and the drain of the transistor 108. The other of the source and the drain of the transistor 111 is electrically connected to the wiring 130. A gate of the transistor 111 is electrically connected to the wiring 123.

The wiring 130 has a function of a monitor line for obtaining the electrical characteristics of the transistor 108. Supplying a specific potential from the wiring 130 to the one electrode of the capacitor 109 through the transistor 111 can stabilize writing of image data.

The pixel 11d performs operation for external correction as initial operation, and generated correction data is stored in the memory circuit MEM. Thus, after the correction data is held in the memory circuit MEM, the pixel 11d operates as in internal correction.

Figure 8:
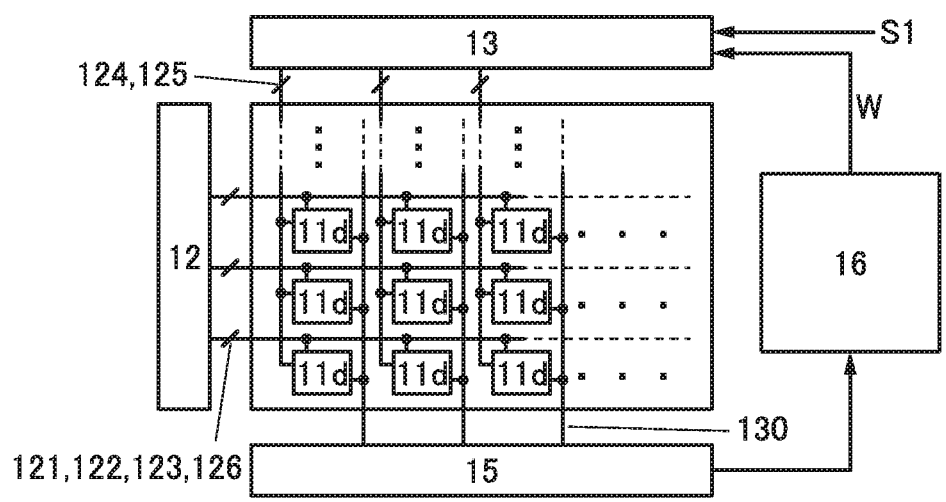
FIG. 8 A block diagram showing a display device.

Generation of correction data and storage in the memory circuit MEM will be described with reference to the circuit diagram in FIG. 7 and a block diagram of a display device shown in FIG. 8. The display device includes a pixel array where the pixels 11d are arranged in a matrix, the row driver 12, the column driver 13, a column driver 15, and a circuit 16.

For the column driver 15, a shift register circuit can be used, for example. The circuit 16 has a function of generating correction data. With the column driver 15, the wirings 130 can be sequentially selected and their output values can be input to the circuit 16.

First, the transistors 101, 106, and 111 are turned on in order that a standard potential at which the transistor 108 is turned on can be written into the node NB. Current output from the transistor 108 is taken into the circuit 16 through the transistor 111. This operation is performed in all the pixels, and the current values output from the transistors 108 when the standard potential is applied to their gates are obtained.

The circuit 16 reads and analyzes the current values and generates the correction data W to be stored in each pixel, on the basis of the transistor that outputs the highest current value. The correction data W is input to the column driver 13 and stored in the memory circuit MEM of each pixel. Note that the circuit 16 may have a function of reading the current values and another circuit may have the function of generating the correction data W.

After that, display operation using the image data to which the correction data is added is performed as described above. Note that the threshold voltage of a transistor sometimes varies significantly over a long period but rarely varies in a short period. Thus, generation of correction data and storage in the memory circuit MEM are not necessarily performed frame by frame and can be performed when power is turned on or power is turned off, for example. The operation time of the display device may be recorded so that the operation can be performed at regular intervals of days, weeks, months, years, or the like.

Although the method for generating the correction data W by measuring the current value output from the transistor 108 is described above, the correction data W may be generated by another method. For example, the correction data W may be generated on the basis of data obtained by reading the luminance of grayscale display with a luminance meter or data obtained by reading a photograph of the display. For generation of the correction data W, inference using a neural network is preferably employed.

This embodiment can be implemented in an appropriate combination with the structures described in the other embodiments and the like.

Embodiment 2

In this embodiment, a structure example of a display device including a liquid crystal element and a structure example of a display device including an EL element are described. Note that the description of the operation and functions related to the correction described in Embodiment 1 is omitted in this embodiment.

Figure 9A:
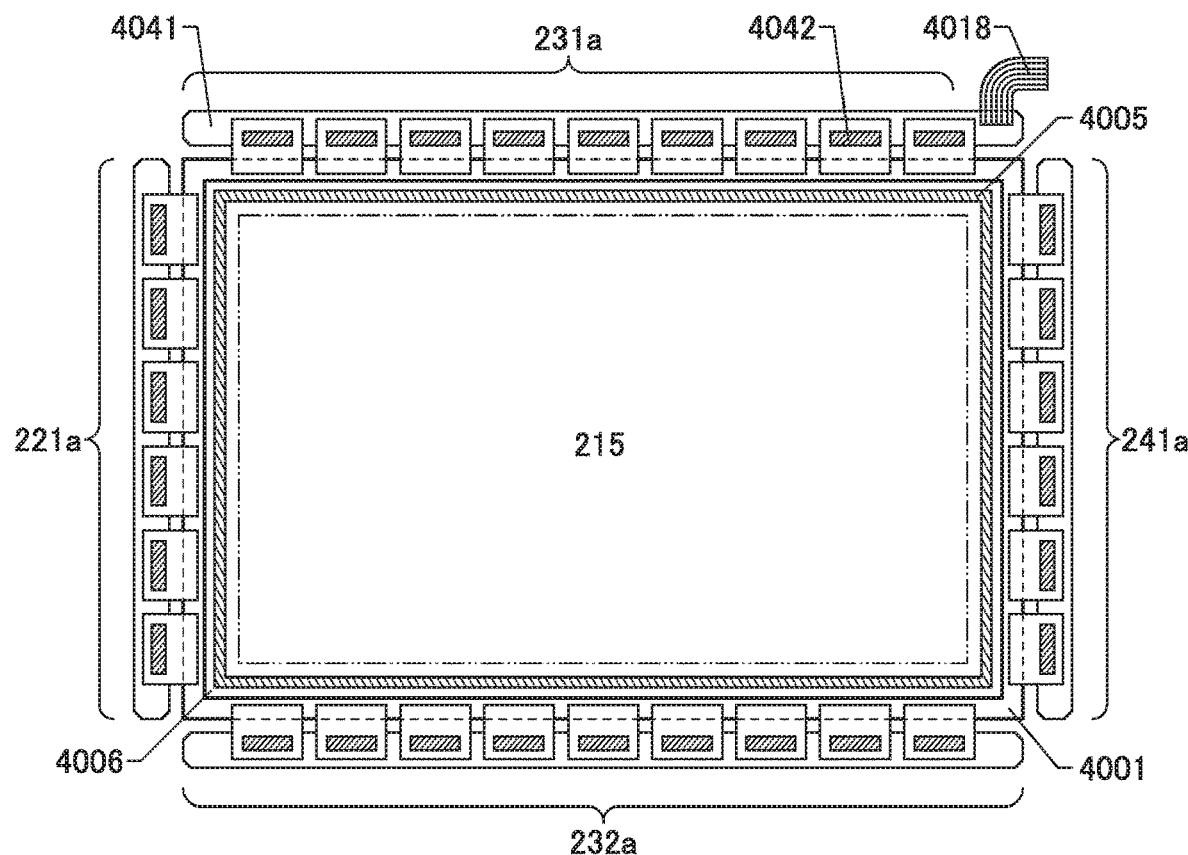
FIG. 9 Diagrams showing a display device.

In FIG. 9(A), a sealant 4005 is provided to surround a display portion 215 provided over a first substrate 4001, and the display portion 215 is sealed with the sealant 4005 and a second substrate 4006.

A pixel array including the pixels described in Embodiment 1 is provided in the display portion 215.

In FIG. 9(A), a scan line driver circuit 221a, a signal line driver circuit 231a, a signal line driver circuit 232a, and a common line driver circuit 241a each include a plurality of integrated circuits 4042 provided over a printed board 4041. The integrated circuits 4042 are formed using a single crystal semiconductor or a polycrystalline semiconductor.

The signal line driver circuit 231a and the signal line driver circuit 232a have a function of the column driver described in Embodiment 1. The scan line driver circuit 221a has a function of the row driver described in the embodiment. The common line driver circuit 241a has a function of supplying a predetermined potential to the common wiring described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a have a function of supplying selection signals to the display portion 215. The integrated circuits 4042 included in the signal line driver circuit 231a and the signal line driver circuit 232a have a function of supplying image data to the display portion 215. The integrated circuits 4042 are mounted on a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

Figure 9B:
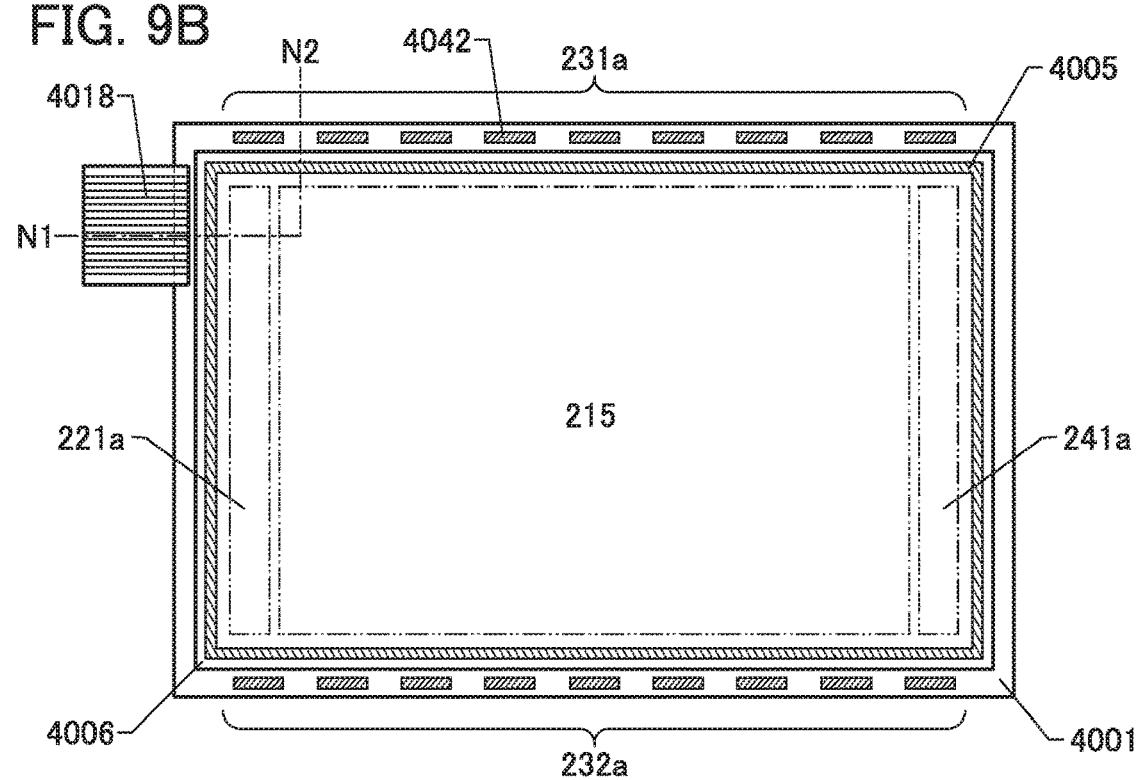

FIG. 9(B) shows an example of mounting the integrated circuits 4042 included in the signal line driver circuit 231a and the signal line driver circuit 232a by a COG method. Some or all of the driver circuits can be integrally formed over the same substrate as the display portion 215, whereby a system-on-panel can be formed.

In the example shown in FIG. 9(B), the scan line driver circuit 221a and the common line driver circuit 241a are formed over the same substrate as the display portion 215. When the driver circuits are formed concurrently with the pixel circuit in the display portion 215, the number of components can be reduced. Thus, the productivity can be improved.

In FIG. 9(B), the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element by the first substrate 4001, the sealant 4005, and the second substrate 4006.

Although the signal line driver circuit 231a and the signal line driver circuit 232a are formed separately and mounted on the first substrate 4001 in the example shown in FIG. 9(B), one embodiment of the present invention is not limited to this structure. The scan line driver circuit may be formed separately and then mounted, or part of the signal line driver circuit or part of the scan line driver circuit may be formed separately and then mounted.

The display device sometimes encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

A transistor included in a peripheral driver circuit and a transistor included in the pixel circuit of the display portion may have the same structure or different structures. Transistors included in the peripheral driver circuit may have the same structure or a combination of two or more kinds of structures. Similarly, transistors included in the pixel circuit may have the same structure or a combination of two or more kinds of structures.

FIG. 10(A) and FIG. 10(B) are cross-sectional views of a portion indicated by the chain line N1-N2 in FIG. 9(B). Display devices shown in FIG. 10(A) and FIG. 10(B) each include an electrode 4015, and the electrode 4015 is electrically connected to a terminal included in the FPC 4018 through an anisotropic conductive layer 4019. In FIG. 10(A) and FIG. 10(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors, and FIG. 10(A) and FIG. 10(B) exemplify the transistor 4010 included in the display portion 215 and the transistor 4011 included in the scan line driver circuit 221a. In the examples shown in FIG. 10(A) and FIG. 10(B), the transistor 4010 and the transistor 4011 are bottom-gate transistors but may be top-gate transistors.

In FIG. 10(A) and FIG. 10(B), the insulating layer 4112 is provided over the transistor 4010 and the transistor 4011. In FIG. 10(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display devices shown in FIG. 10(A) and FIG. 10(B) each include a capacitor 4020. The capacitor 4020 includes an electrode 4021 formed in the same step as a gate electrode of the transistor 4010, and an electrode formed in the same step as a source electrode and a drain electrode thereof. These electrodes overlap with each other with an insulating layer 4103 positioned therebetween.

In general, the capacitance of a capacitor provided in a pixel portion of a display device is set in consideration of leakage current or the like of a transistor provided in the pixel portion so that charge can be held for a predetermined period. The capacitance of the capacitor may be set in consideration of off-state current of the transistor, or the like.

The transistor 4010 provided in the display portion 215 is electrically connected to the display element. FIG. 10(A) shows an example of a liquid crystal display device using a liquid crystal element as a display element. In FIG. 10(A), a liquid crystal element 4013 that is a display element includes the first electrode layer 4030, a second electrode layer 4031, and a liquid crystal layer 4008. An insulating layer 4032 and an insulating layer 4033 having a function of alignment films are provided to sandwich the liquid crystal layer 4008. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided to adjust a distance (cell gap) between the first electrode layer 4030 and the second electrode layer 4031. Note that a spherical spacer may be used.

A black matrix (light-blocking layer), a coloring layer (color filter), an optical member (optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source. A micro LED or the like may be used as the backlight or the side light.

In the display device shown in FIG. 10(A), a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stacked-layer film of films containing the materials of the coloring layer can also be used for the light-blocking layer. For example, a stacked-layer structure of a film containing a material used for a coloring layer that transmits light of a certain color and a film containing a material used for a coloring layer that transmits light of another color can be employed. The use of the same material for the coloring layer and the light-blocking layer is preferable, in which case the same apparatus can be used and the process can be simplified.

Examples of a material that can be used for the coloring layer include a metal material, a resin material, and a resin material containing a pigment or dye. The light-blocking layer and the coloring layer may be formed by a method similar to the above-described methods for forming the layers. For example, an inkjet method may be used.

The display devices shown in FIG. 10(A) and FIG. 10(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting element utilizing electroluminescence (EL element) can be used as the display element included in the display device. An EL element includes a layer containing a light-emitting compound (also referred to as an "EL layer") between a pair of electrodes. By generating a potential difference between the pair of electrodes that is greater than the threshold voltage of the EL element, holes are injected from the anode side and electrons are injected from the cathode side into the EL layer. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element.

Besides the light-emitting compound, the EL layer may also include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions. Note that the description is made here using an organic EL element as a light-emitting element.

In order that light emitted from the light-emitting element can be extracted, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 10(B) shows an example of a light-emitting display device using a light-emitting element as a display element (also referred to as an "EL display device"). A light-emitting element 4513 that is a display element is electrically connected to the transistor 4010 provided in the display portion 215. The structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition wall 4510 is formed using an organic insulating material or an inorganic insulating material. It is particularly preferable that a photosensitive resin material be used, and an opening portion be formed over the first electrode layer 4030 such that a side surface of the opening portion is formed to be an inclined surface having continuous curvature.

The light-emitting layer 4511 may be formed using a single layer or a plurality of layers stacked.

The emission color of the light-emitting element 4513 can be white, red, green, blue, cyan, magenta, yellow, or the like depending on the material included in the light-emitting layer 4511.

Examples of a method for achieving color display include a method in which the light-emitting element 4513 that emits white light is combined with a coloring layer and a method in which the light-emitting element 4513 that emits light of a different emission color is provided in each pixel. The former method is more productive than the latter method. On the other hand, the latter method, which requires separate formation of the light-emitting layer 4511 pixel by pixel, is less productive than the former method. However, the latter method can produce higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can serve as a light-emitting material.

A protective layer may be formed over the second electrode layer 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In a space that is sealed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic-based resin, polyimide, an epoxy-based resin, a silicone-based resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a light curable resin, a thermosetting resin, or a curable resin that is cured at room temperature, such as a two-component-mixture-type resin, can be used. In addition, a drying agent may be contained in the sealant 4005.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

When the light-emitting element has a microcavity structure, light with high color purity can be extracted. Furthermore, when a microcavity structure and a color filter are used in combination, glare can be reduced and visibility of a displayed image can be increased.

The first electrode layer and the second electrode layer (also referred to as a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

The first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof.

The first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

This embodiment can be implemented in an appropriate combination with the structures described in the other embodiments and the like.

Embodiment 3

In this embodiment, an operation mode that can be performed in the display device of one embodiment of the present invention is described with reference to FIG. 11.

Note that a normal operation mode (Normal mode) with a normal frame frequency (typically, higher than or equal to 60 Hz and lower than or equal to 240 Hz) and an idling stop (IDS) driving mode with a low frame frequency are described below as examples.

Note that the IDS driving mode refers to a driving method in which the writing processing of image data is performed, and then, rewriting of image data is stopped. Increasing the interval between writing of image data and subsequent writing of image data can reduce the power that would be consumed by writing of image data in that interval. The IDS driving mode can be performed at a frame frequency that is approximately 1/100 to 1/10 of that of the normal operation mode, for example. Video signals for a still image are the same between consecutive frames. Thus, the IDS driving mode is particularly effective in displaying a still image. When an image is displayed using IDS driving, power consumption is reduced, image flickering (flicker) is suppressed, and eyestrain can be reduced.

Figure 11A:
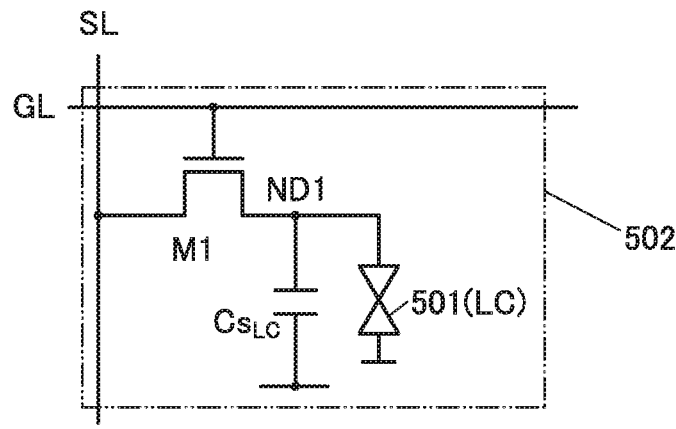
FIG. 11 Diagrams showing examples of operation modes of a display device.
Figure 11B:
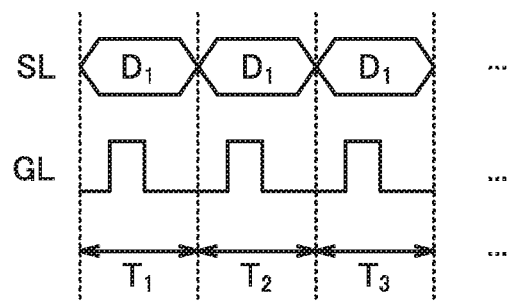
Figure 11C:
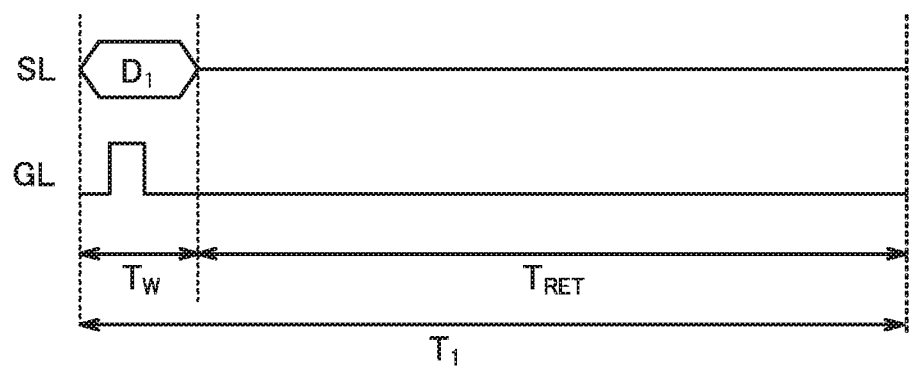

FIG. 11(A) to FIG. 11(C) are a circuit diagram showing a pixel circuit and timing charts showing a normal driving mode and an IDS driving mode. A pixel circuit 502 shown in FIG. 11(A) is a pixel in a typical liquid crystal display device and includes a signal line SL, a gate line GL, a transistor M1 connected to the signal line SL and the gate line GL, and a capacitor $Cs_{LC}$ and a liquid crystal element 501 connected to the transistor M1. Note that a node to which a pixel electrode of the first display element 501, one of a source and a drain of the transistor M1, and the capacitor $Cs_{LC}$ are connected is referred to as a node ND1. The IDS driving mode can be used for not only a liquid crystal display device but also an EL display device.

Here, the transistor M1 corresponds to the transistor 101 in the pixel 11a or the transistor 106 in the pixel 11b or 11c described in Embodiment 1.

The transistor M1 can be a leakage path of data $D_1$. Thus, the off-state current of the transistor M1 is preferably as low as possible. An OS transistor is preferably used as the transistor M1. The OS transistor has a feature of an extremely low leakage current (off-state current) in an off state compared with a transistor using polycrystalline silicon or the like. The use of the OS transistor as the transistor M1 enables charge supplied to the node ND1 to be held for a long period.

In the circuit diagram shown in FIG. 11(A), the liquid crystal element 501 also becomes a leakage path of the data $D_1$. Thus, in order that IDS driving can be performed appropriately, the resistivity of the liquid crystal element 501 is preferably higher than or equal to $1.0 \times 10^{14} \Omega \cdot cm$.

Note that for example, an In—Ga—Zn oxide or an In—Zn oxide can be suitably used for a channel region of the above OS transistor. For the above In—Ga—Zn oxide, a composition of In:Ga:Zn=4:2:4.1 [atomic ratio] or a neighborhood thereof can be typically employed.

FIG. 11(B) is a timing chart showing the waveforms of signals supplied to the signal line SL and the gate line GL in the normal driving mode. In the normal driving mode, operation is performed at a normal frame frequency (e.g., 60 Hz). FIG. 11(B) shows Periods $T_1$ to $T_3$. In each frame period, a scan signal is supplied to the gate line GL and the data $D_1$ is written from the signal line SL into the node ND1. This operation is performed both to write the same data $D_1$ in Periods $T_1$ to $T_3$ and to write different data in Periods $T_1$ to $T_3$.

Meanwhile, FIG. 11(C) is a timing chart showing the waveforms of signals supplied to the signal line SL and the gate line GL in the IDS driving mode. In the IDS driving, operation is performed at a low frame frequency (e.g., 1 Hz). One frame period is shown as Period $T_1$, wherein a data writing period is shown as $T_W$ and a data holding period is shown as Period $T_{RET}$. In the IDS driving mode, a scan signal is supplied to the gate line GL and the data $D_1$ of the signal line SL is written in Period $T_W$, the gate line GL is fixed to a low-level voltage in Period $T_{RET}$, and the transistor M1 is turned off so that the written data $D_1$ is held. Note that the low frame frequency may be higher than or equal to 0.1 Hz and lower than 60 Hz, for example.

Thus, the use of the IDS driving mode can reduce the power consumption of the display device.

This embodiment can be implemented in an appropriate combination with the structures described in the other embodiments and the like.

Embodiment 4

In this embodiment, a configuration example of a semiconductor device functioning as a neural network that can be used for the circuit 14 or the like described in Embodiment 1 will be described.

Figure 12A:
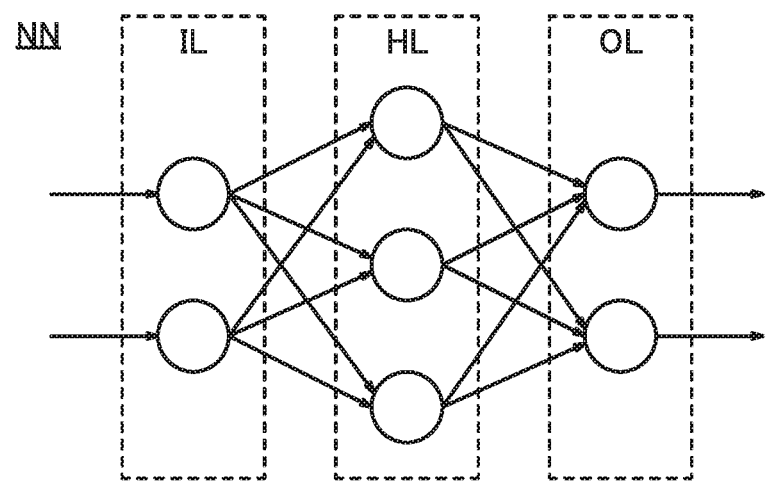
FIG. 12 Diagrams showing a configuration example of a neural network.

As shown in FIG. 12(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 12B:
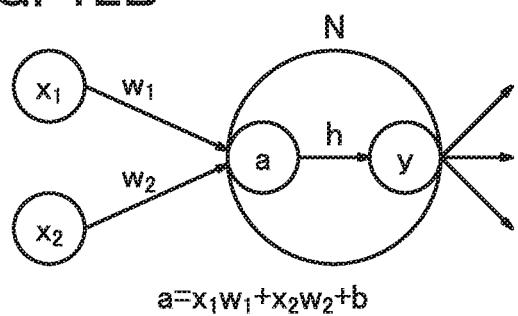

FIG. 12(B) shows an example of an operation with the neurons. Here, a neuron N and two neurons in the previous layer that output signals to the neuron N are shown. An output $x_1$ of a neuron in the previous layer and an output $x_2$ of a neuron in the previous layer are input to the neuron N. Then, in the neuron N, a total sum $x_1 w_1 + x_2 w_2$ of a multiplication result $(x_1 w_1)$ of the output $x_1$ and a weight $w_1$ and a multiplication result $(x_2 w_2)$ of the output $x_2$ and a weight $w_2$ is calculated, and then a bias b is added as necessary, so that a value $a = x_1 w_1 + x_2 w_2 + b$ is obtained. Then, the value a is converted with an activation function h, and an output signal $y = h(a)$ is output from the neuron N.

As described above, the operation with the neurons includes the product-sum operation, that is, the operation that sums the products of the outputs and the weights of the neurons in the previous layer ($x_1 w_1 + x_2 w_2$ described above). This product-sum operation may be performed using a program on software or using hardware. In the case where the product-sum operation is performed using hardware, a product-sum operation circuit can be used. Either a digital circuit or an analog circuit may be used as this product-sum operation circuit.

An analog circuit is used as the product-sum operation circuit in one embodiment of the present invention. Thus, the circuit scale of the product-sum operation circuit can be reduced, or an improved processing speed and lower power consumption can be achieved by reduced frequency of access to a memory.

The product-sum operation circuit may be formed using a Si transistor or an OS transistor. An OS transistor is particularly suitable as a transistor included in an analog memory of the product-sum operation circuit because of its extremely low off-state current. Note that the product-sum operation circuit may be formed using both a Si transistor and an OS transistor. A configuration example of a semiconductor device having a function of the product-sum operation circuit will be described below.

Configuration Example of Semiconductor Device

Figure 13:
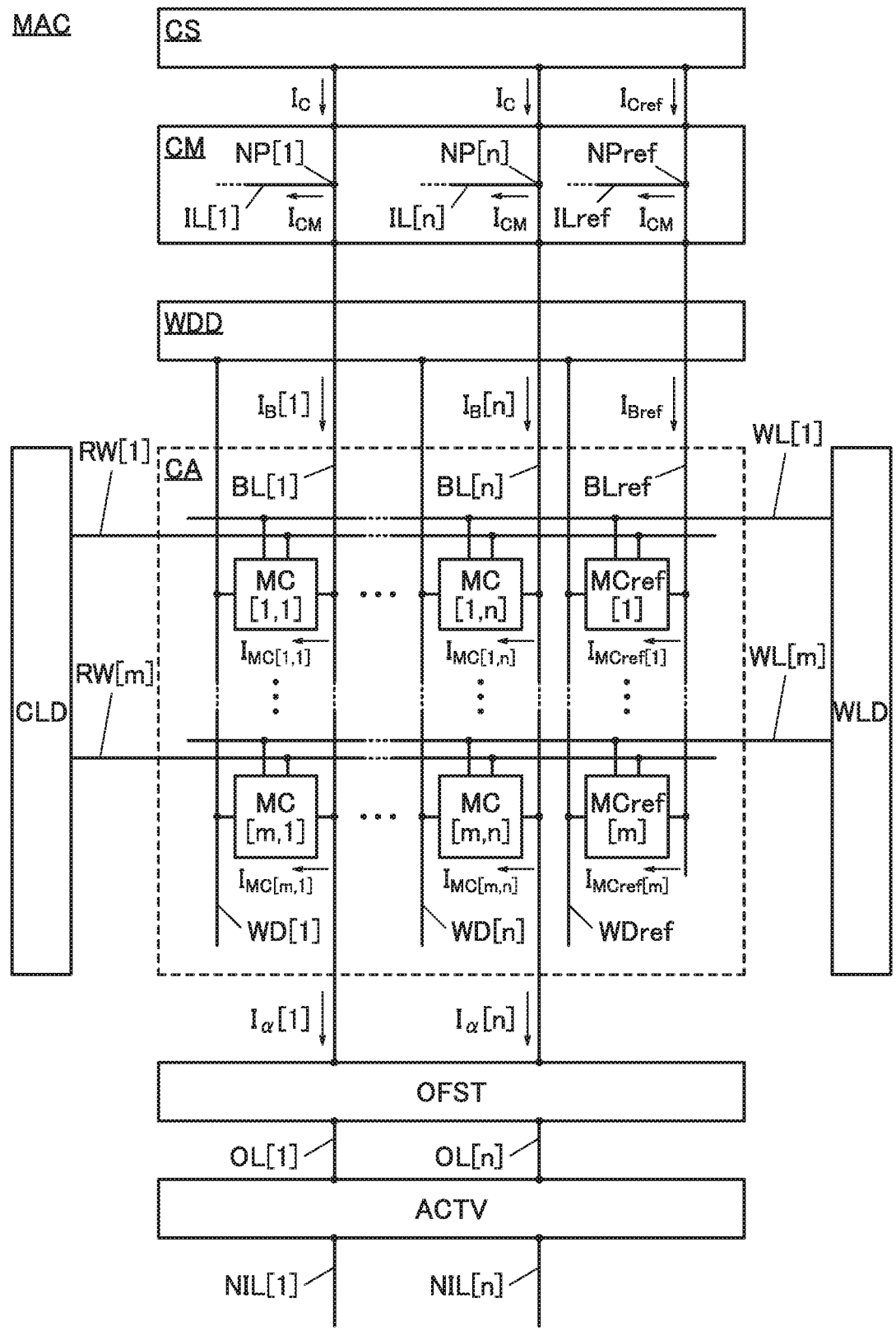
FIG. 13 A diagram showing a configuration example of a semiconductor device.

FIG. 13 shows a configuration example of a semiconductor device MAC having a function of performing an operation of a neural network. The semiconductor device MAC has a function of performing a product-sum operation of first data corresponding to the connection strength between neurons (weight) and second data corresponding to input data. Note that the first data and the second data can each be analog data or multilevel data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref FIG. 13 shows a configuration example in which the cell array CA includes the memory cells MC in m rows and n columns (MC[1, 1] to MC[m, n]) and the m memory cells MCref (MCref[1] to MCref[m]) (m and n are integers greater than or equal to 1). The memory cells MC each have a function of storing the first data. In addition, the memory cells MCref each have a function of storing reference data used for the product-sum operation. Note that the reference data can be analog data or multilevel data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i, j]}$, and a current flowing between the memory cell MCref[i] and the wiring BLref is denoted by $I_{MCref[i]}$.

Figure 14:
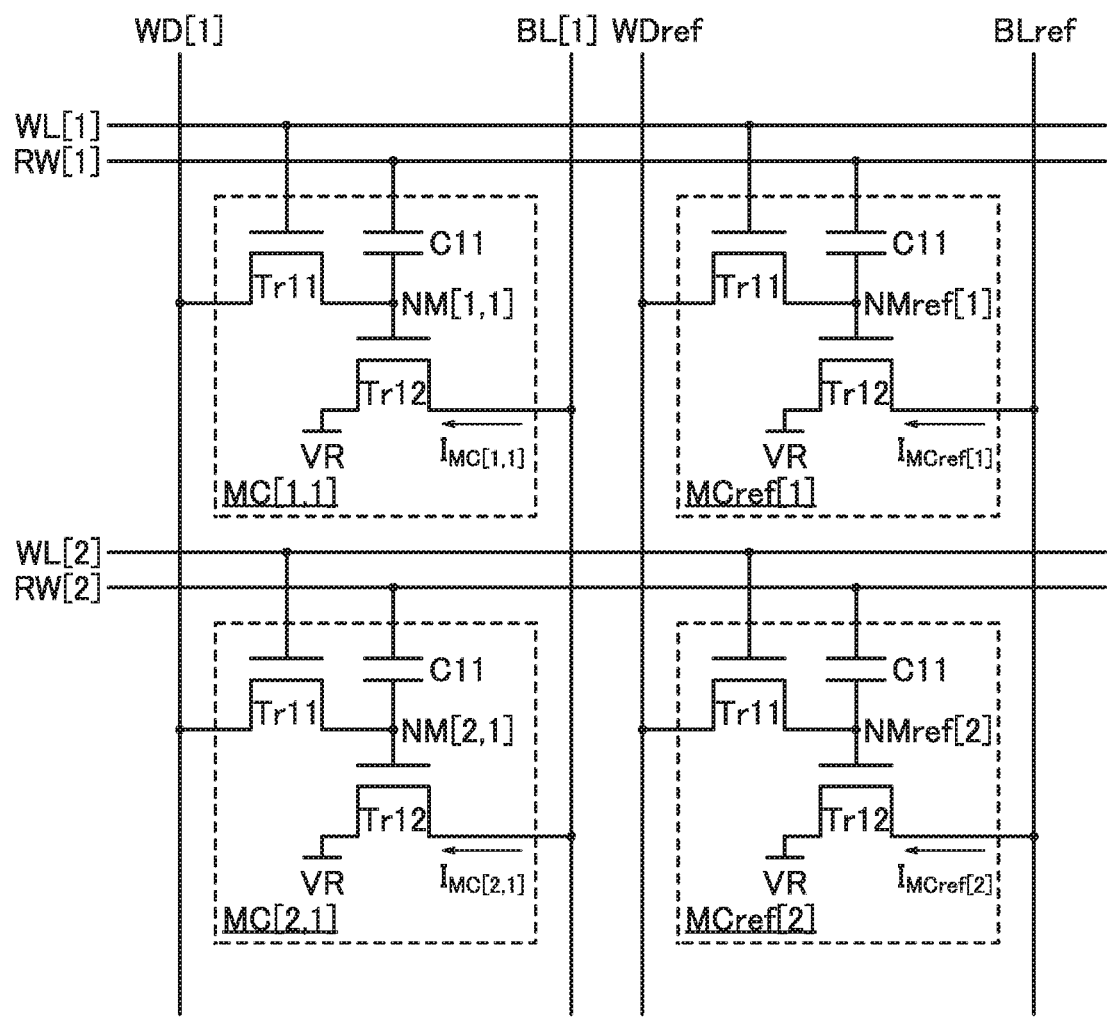
FIG. 14 A diagram showing a configuration example of memory cells.

FIG. 14 shows a specific configuration example of the memory cells MC and the memory cells MCref Although the memory cells MC[1, 1] and MC[2, 1] and the memory cells MCref[1] and MCref[2] are shown in FIG. 14 as typical examples, similar configurations can be used for other memory cells MC and memory cells MCref. The memory cells MC and the memory cells MCref each include transistors Tr11 and Tr12 and a capacitor C11. Here, the case where the transistor Tr11 and the transistor Tr12 are n-channel transistors will be described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

A node connected to the one of the source and the drain of the transistor Tr11, the gate of the transistor Tr12, and the first electrode of the capacitor C11 is referred to as the node NM. The nodes NM in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The node NM and the node NMref function as holding nodes of the memory cell MC and the memory cell MCref, respectively. The first data is held in the node NM and the reference data is held in the node NMref Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$, from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This inhibits a change in the potential of the node NM or the node NMref, so that the operation accuracy can be improved. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref Here, portions where the wirings IL[1] to IL[n] are connected to the respective wirings BL[1] to BL[n] are referred to as nodes NP[1] to NP[n]. Furthermore, a portion where the wiring ILref is connected to the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example shown in FIG. 13, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data to be stored in the memory cells MC to the wirings WD[1] to WD[n]. The circuit WDD also has a function of supplying a potential corresponding to the reference data to be stored in the memory cells MCref to the wiring WDref The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1]

to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 15:
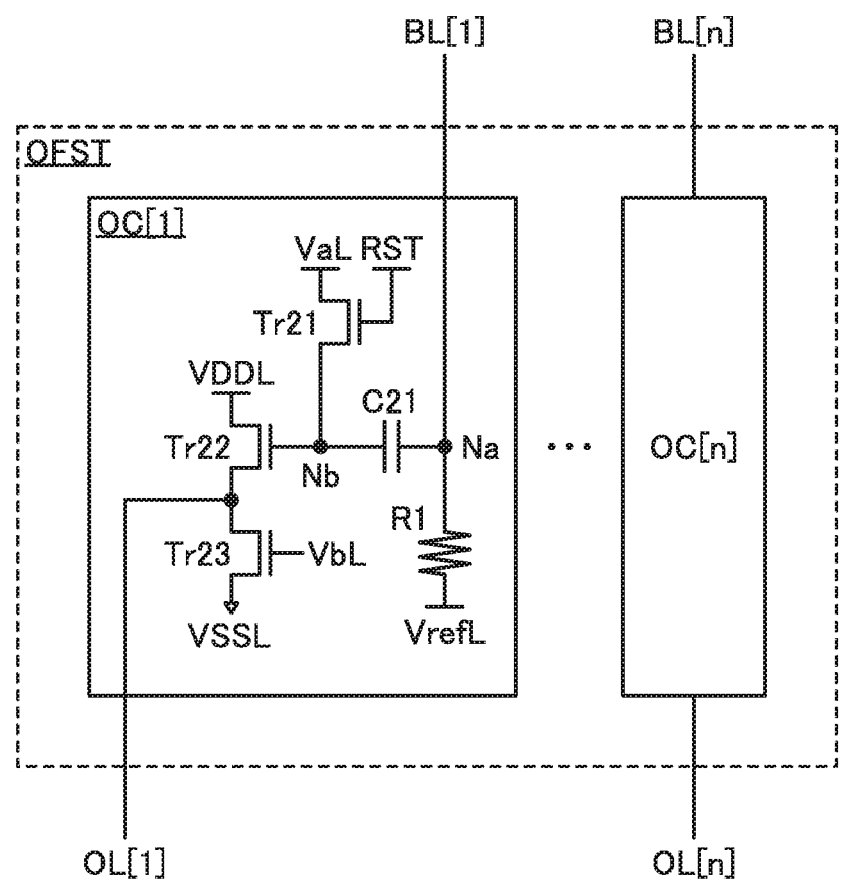
FIG. 15 A diagram showing a configuration example of an offset circuit.

FIG. 15 shows a configuration example of the offset circuit OFST. The offset circuit OFST shown in FIG. 15 includes circuits OC[1] to OC[n]. The circuits OC[1] to OC[n] each include a transistor Tr21, a transistor Tr22, a transistor Tr23, a capacitor C21, and a resistor R1. Connection relations of the elements are shown in FIG. 15. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1. At this time, the transistor Tr21 is in an on state, and thus the potential Va is supplied to the node Nb. Then, the transistor Tr21 is brought into an off state.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb changes because of capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. When the threshold voltage of the transistor Tr22 is $V_{th}$, a potential $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistance value of the resistor R1, and the potential Vref. Here, since the resistance value of the resistor R1 and the potential Vref are known, the amount of change in the current flowing to the wiring BL can be found from the potential $\Delta V_{Na}$.

A signal corresponding to the amount of current and/or the amount of change in the current that are/is detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with the predefined activation function. As the activation function, for example, a sigmoid function, a tan h function, a softmax function, a ReLU function, a threshold function, or the like can be used. The signal converted by the activation function circuit ACTV is output as output data to the wirings NIL[1] to NIL[n].

Operation Example of Semiconductor Device

The product-sum operation of the first data and the second data can be performed with the above semiconductor device MAC. An operation example of the semiconductor device MAC at the time of performing the product-sum operation is described below.

Figure 16:
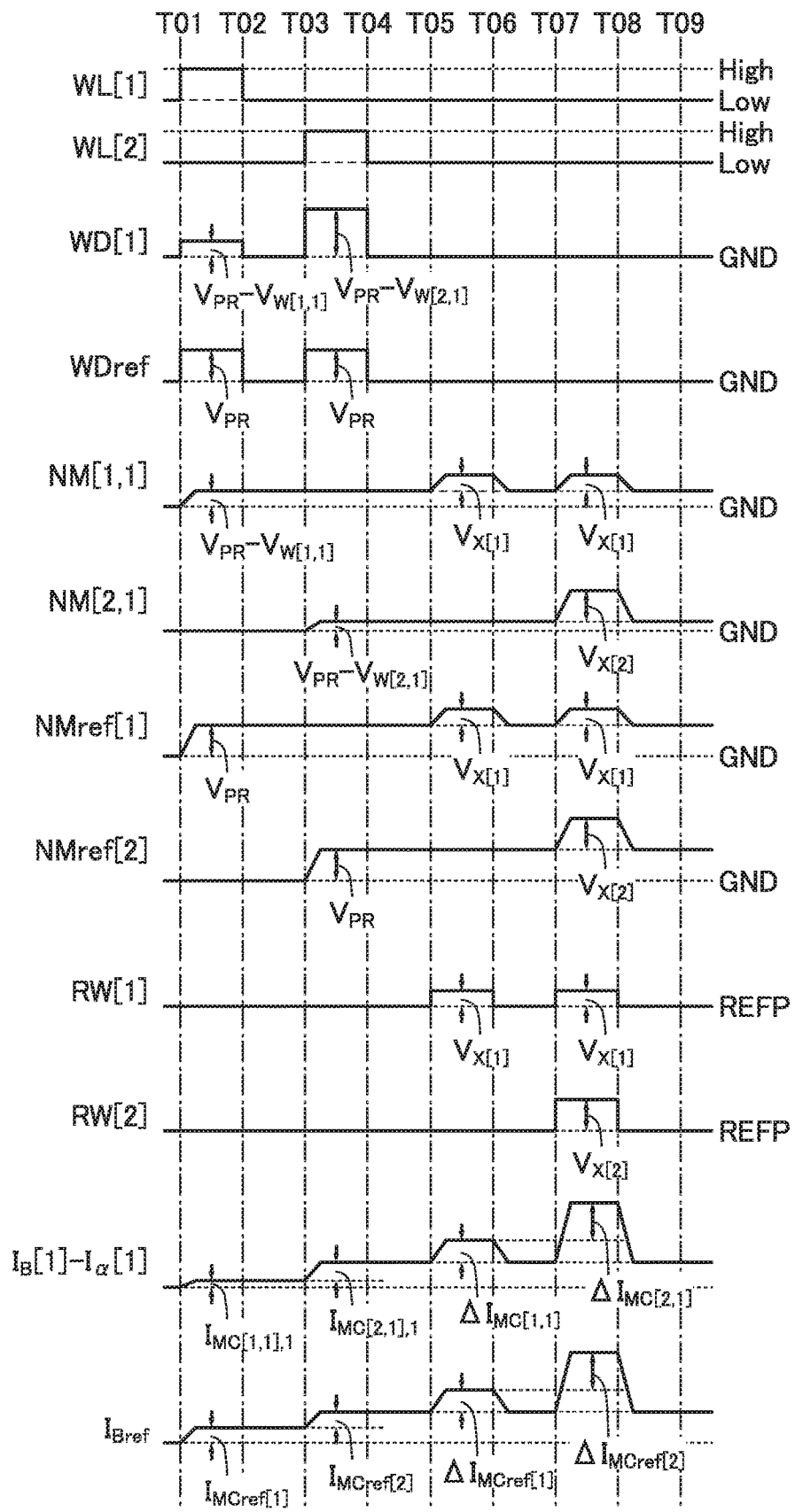
FIG. 16 A timing chart showing operation of a semiconductor device.

FIG. 16 shows a timing chart of the operation example of the semiconductor device MAC. FIG. 16 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 14 and changes in the values of a current $I_B[1]-I_\alpha[1]$ and the current $I_{Bref}$. The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] shown in FIG. 14 as a typical example, the other memory cells MC and the other memory cells MCref can also be operated in a similar manner.

[Storage of First Data]

First, from Time T01 to Time T02, the potential of the wiring WL[1] becomes a high level, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wiring RW[1] and the wiring RW[2] become reference potentials (REFP). Note that the potential $V_{W[1, 1]}$ is the potential corresponding to the first data stored in the memory cell MC[1, 1]. The potential $V_{PR}$ is the potential corresponding to the reference data. Thus, the transistors Tr11 included in the memory cell MC[1, 1] and the memory cell MCref[1] are turned on, and the potential of the node NM[1, 1] and the potential of the node NMref[1] become $V_{PR}-V_{W[1, 1]}$ and $V_{PR}$, respectively.

In this case, a current $I_{MC[1, 1], 0}$ flowing from the wiring BL[1] to the transistor Tr12 in the memory cell MC[1, 1] can be expressed by the formula shown below. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1,1],0}=k(V_{PR}-V_{W[1,1]}-V_{th})^2 \qquad (E1)$$

Furthermore, a current $I_{MCref[1],0}$ flowing from the wiring BLref to the transistor Tr12 in the memory cell MCref[1] can be expressed by the formula shown below.

$$I_{MCref[1],0} = k(V_{PR} - V_{th})^2 \quad (E2)$$

Next, from Time T02 to Time T03, the potential of the wiring WL[1] becomes a low level. Consequently, the transistors Tr11 included in the memory cell MC[1, 1] and the memory cell MCref[1] are turned off, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, from Time T03 to Time T04, the potential of the wiring WL[2] becomes the high level, the potential of the wiring WD[1] becomes a potential greater than the ground potential by $V_{PR} - V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are turned on, and the potentials of the node NM[1, 1] and the node NMref[1] become $V_{PR} - V_{W[2, 1]}$ and $V_{PR}$, respectively.

Here, a current $I_{MC[2, 1], 0}$ flowing from the wiring BL[1] to the transistor Tr12 in the memory cell MC[2, 1] can be expressed by the formula shown below.

$$I_{MC[2,1],0} = k(V_{PR} - V_{W[2,1]} - V_{th})^2 \quad (E3)$$

Furthermore, a current $I_{MCref[2], 0}$ flowing from the wiring BLref to the transistor Tr12 in the memory cell MCref[2] can be expressed by the formula shown below.

$$I_{MCref[2],0} = k(V_{PR} - V_{th})^2 \quad (E4)$$

Next, from Time T04 to Time T05, the potential of the wiring WL[2] becomes the low level. Consequently, the transistors Tr11 included in the memory cell MC[2, 1] and the memory cell MCref[2] are turned off, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. A current from the current source circuit CS is supplied to the wiring BLref. The current flowing through the wiring BLref is discharged to the current mirror circuit CM and the memory cells MCref[1] and MCref[2]. The formula shown below holds where $I_{Cref}$ is the current supplied from the current source circuit CS to the wiring BLref and $I_{CM, 0}$ is the current discharged from the wiring BLref to the current mirror circuit CM.

$$I_{Cref} - I_{CM,0} = I_{MCref[1],0} + I_{MCref[2],0} \quad (E5)$$

A current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{C, 0}$ is the current supplied from the current source circuit CS to the wiring BL[1] and $I_{\alpha, 0}$ is the current flowing from the wiring BL[1] to the offset circuit OFST.

$$I_C - I_{CM,0} = I_{MC[1,1],0} + I_{MC[2,1],0} + I_{\alpha,0} \quad (E6)$$

[Product-Sum Operation of First Data and Second Data]

Next, from Time T05 to Time T06, the potential of the wiring RW[1] becomes a potential greater than the reference potential by $V_{X[1]}$. At this time, the potential $V_{X[1]}$ is supplied to the capacitors C11 in the memory cell MC[1, 1] and the memory cell MCref[1], so that the potentials of the gates of the transistors Tr12 are increased owing to capacitive coupling. Note that the potential $V_{X[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_x$ can be determined in consideration of the capacitive coupling coefficient.

When the potential $V_{X[1]}$ is supplied to the capacitors C11 in the memory cell MC[1] and the memory cell MCref[1], the potentials of the node NN[1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to Time T06 can be expressed by the formula shown below.

$$I_{MC[1,1],1} = k(V_{PR} - V_{W[1,1]} + V_{X[1]} - V_{th})^2 \quad (E7)$$

That is, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

A current $I_{MCref[1], 1}$ flowing from the wiring BLref to the transistor Tr12 in the memory cell MCref[1] from Time T05 to Time T06 can be expressed by the formula shown below.

$$I_{MCref[1],1} = k(V_{PR} + V_{X[1]} - V_{th})^2 \quad (E8)$$

That is, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 1}$ is the current discharged from the wiring BLref to the current mirror circuit CM.

$$I_{Cref} - I_{CM,1} = I_{MCref[1],1} + I_{MCref[2],1} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from the formula (E1) to the formula (E10), a difference between the current $I_{\alpha, 0}$ and the current $I_{\alpha, 1}$ (differential current $\Delta I_\alpha$) can be expressed by the formula shown below.

$$\Delta I_\alpha = I_{\alpha,1} - I_{\alpha,0} = 2kV_{W[1,1]}V_{X[1]} \tag{E11}$$

Thus, the differential current $\Delta I_\alpha$ is a value corresponding to the product of the potentials $V_{W[1, 1]}$ and $V_{X[1]}$.

After that, from Time T06 to Time T07, the potential of the wiring RW[1] becomes the ground potential, and the potentials of the node NM[1, 1] and the node NMref[1] become similar to the potentials thereof from Time T04 to Time T05.

Next, from Time T07 to Time T08, the potential of the wiring RW[1] becomes the potential greater than the reference potential by $V_{X[1]}$, and a potential greater than the reference potential by $V_{X[2]}$ is supplied as the potential of the wiring RW[2]. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ owing to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ owing to capacitive coupling.

Here, the current $I_{MC[2, 1], 1}$ flowing from the wiring BL[1] to the transistor Tr12 in the memory cell MC[2, 1] from Time T07 to Time T08 can be expressed by the formula shown below.

$$I_{MC[2,1],1} = k(V_{PR} - V_{W[2,1]} + V_{X[2]} - V_{th})^2 \tag{E12}$$

That is, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

Here, the current $I_{MCref[2], 1}$ flowing from the wiring BLref to the transistor Tr12 in the memory cell MCref[2] from Time T05 to Time T06 can be expressed by the formula shown below.

$$I_{MCref[2],1} = k(V_{PR} + V_{X[2]} - V_{th})^2 \tag{E13}$$

That is, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 2}$ is the current discharged from the wiring BLref to the current mirror circuit CM.

$$I_{Cref} - I_{CM,2} = I_{MCref[1],1} + I_{MCref[2],1} \tag{E14}$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \tag{E15}$$

In addition, from the formula (E1) to the formula (E8) and the formula (E12) to the formula (E15), a difference between the current $I_{\alpha, 0}$ and the current $I_{\alpha, 2}$ (differential current $\Delta I_\alpha$) can be expressed by the formula shown below.

$$\Delta I_\alpha = I_{\alpha,2} - I_{\alpha,0} = 2k(V_{W[1,1]}V_{X[1]} + V_{W[2,1]}V_{X[2]}) \tag{E16}$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, from Time T08 to Time T09, the potentials of the wirings RW[1] and RW[2] become the ground potential, and the potentials of the nodes NM[1, 1] and NM[2, 1] and the nodes NMref[1] and NMref[2] become similar to the potentials thereof from Time T04 to Time T05.

As represented by the formula (E9) and the formula (E16), the differential current $\Delta I_\alpha$ input to the offset circuit OFST is a value corresponding to the sum of the products of the potentials $V_X$ corresponding to the first data (weight) and the potentials $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be set to any number. In the case where the number m of rows of the memory cells MC and the memory cells MCref is a given number, the differential current $\Delta I_\alpha$ can be expressed by the formula shown below.

$$\Delta I_\alpha = 2k\Sigma_i V_{W[i,1]} V_{X[i]} \tag{E17}$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cells MC and the memory cells MCref in FIG. 14 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 12(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation of the neural network can be performed using the semiconductor device MAC as described above. Furthermore, the use of the memory cells MC and the memory cells MCref shown in FIG. 14 in the cell array CA can provide the integrated circuit IC with improved operation accuracy, lower power consumption, or a reduced circuit scale.

This embodiment can be implemented in an appropriate combination with the structures described in the other embodiments and the like.

Embodiment 5

Examples of electronic devices that can include the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head-mounted displays), navigation systems, audio reproducing devices (e.g., car audio players and digital audio players), copiers, facsimiles, printers, multifunction printers, automated teller machines (ATM), and vending machines. FIG. 17 shows specific examples of these electronic devices.

Figure 17A:
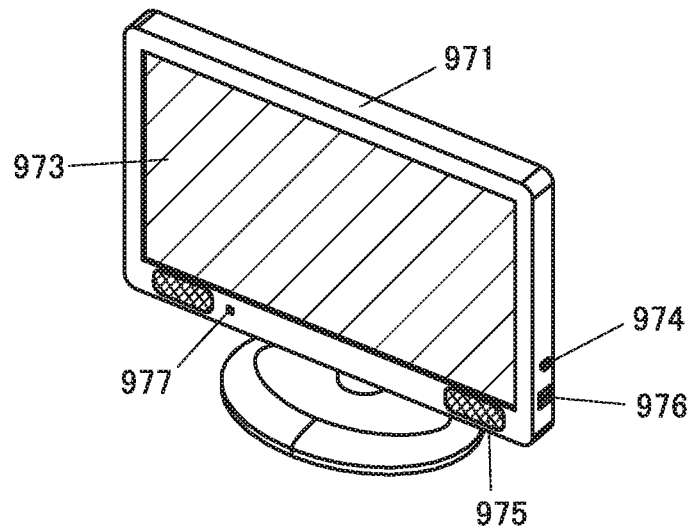
FIG. 17 Diagrams showing electronic devices.

FIG. 17(A) is a television, which includes a housing 971, a display portion 973, an operation key 974, speakers 975, a communication connection terminal 976, an optical sensor 977, and the like. The display portion 973 is provided with a touch sensor, and input operation can be performed. When the display device of one embodiment of the present invention is used for the display portion 973, high-quality display can be performed.

Figure 17B:
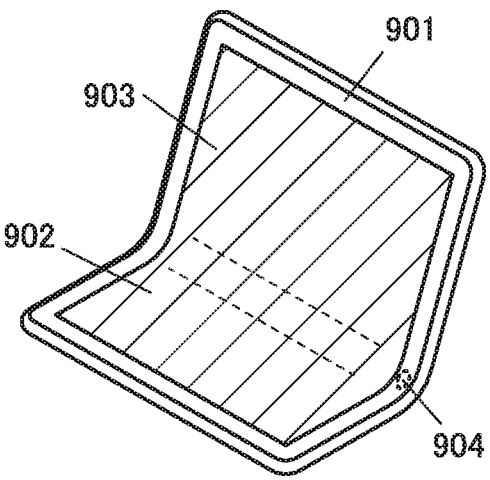

FIG. 17(B) is an information processing terminal, which includes a housing 901, a display portion 902, a display portion 903, a sensor 904, and the like. The display portion 902 and the display portion 903 are formed using one display panel and are flexible. The housing 901 is also flexible, can be used in a bent state as shown in the figure, and can also be used in a flat plate-like shape like a tablet terminal. The sensor 904 can sense the shape of the housing 901, and for example, it is possible to switch display on the display portion 902 and the display portion 903 when the housing is bent. When the display device of one embodiment of the present invention is used for the display portion 902 and the display portion 903, high-quality display can be performed.

Figure 17C:
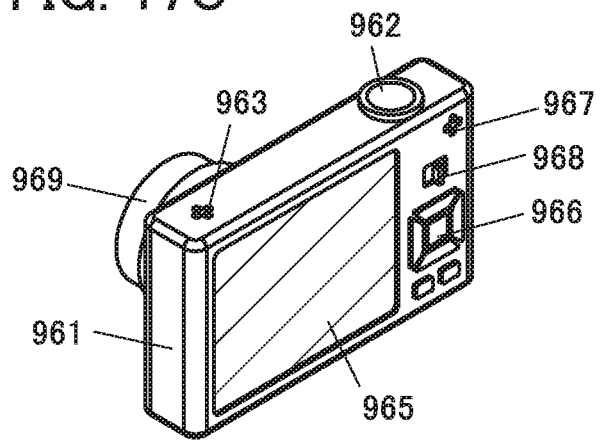

FIG. 17(C) is a digital camera, which includes a housing 961, a shutter button 962, a microphone 963, a speaker 967, a display portion 965, operation keys 966, a zoom lever 968, a lens 969, and the like. When the display device of one embodiment of the present invention is used for the display portion 965, high-quality display can be performed.

Figure 17D:
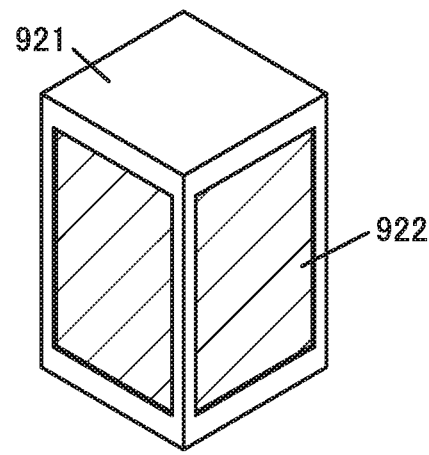

FIG. 17(D) is digital signage, which includes large display portions 922. The digital signage can be installed on the side surface of a pillar 921, for example. When the display device of one embodiment of the present invention is used for the display portions 922, high-quality display can be performed.

Figure 17E:
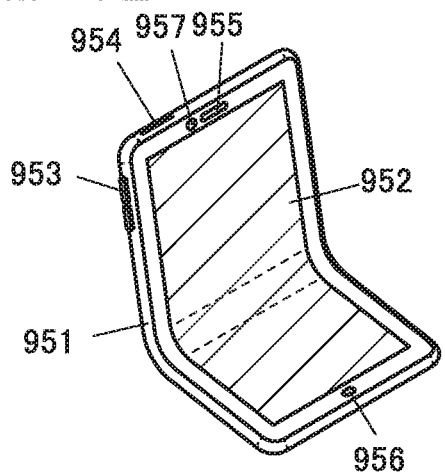

FIG. 17(E) is a cellular phone, which includes a housing 951, a display portion 952, an operation button 953, an external connection port 954, a speaker 955, a microphone 956, a camera 957, and the like. The display portion 952 of the cellular phone includes a touch sensor. A variety of operations such as making a call and inputting text can be performed by touch on the display portion 952 with a finger, a stylus, or the like. The housing 901 and the display portion 952 are flexible and can be used in a bent state as shown in the figure. When the display device of one embodiment of the present invention is used for the display portion 952, high-quality display can be performed.

Figure 17F:
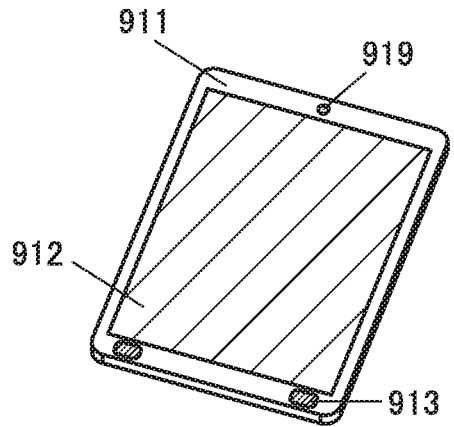

FIG. 17(F) is a portable data terminal, which includes a housing 911, a display portion 912, speakers 913, a camera 919, and the like. A touch panel function of the display portion 912 enables input and output of information. When the display device of one embodiment of the present invention is used for the display portion 912, high-quality display can be performed.

This embodiment can be implemented in an appropriate combination with the structures described in the other embodiments and the like.

REFERENCE NUMERALS

11: pixel, 11a: pixel, 11b: pixel, 11c: pixel, 11d: pixel, 12: row driver, 13: column driver, 14: circuit, 15: column driver, 16: circuit, 101: transistor, 102: transistor, 103: capacitor, 104: capacitor, 105: liquid crystal element, 106: transistor, 107: transistor, 108: transistor, 109: capacitor, 110: EL element, 111: transistor, 115: transistor, 116: transistor, 117: capacitor, 121: wiring, 122: wiring, 123: wiring, 124: wiring, 125: wiring, 126: wiring, 127: common wiring, 128: common wiring, 129: common wiring, 130: wiring, 215: display portion, 221a: scan line driver circuit, 231a: signal line driver circuit, 232a: signal line driver circuit, 241a: common line driver circuit, 501: liquid crystal element, 502: pixel circuit, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: electrode layer, 4031: electrode layer, 4032: insulating layer, 4033: insulating layer, 4035: spacer, 4041: printed board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4510: partition wall, 4511: light-emitting layer, 4513: light-emitting element, 4514: filler.

The invention claimed is:

1. A display device comprising:
a first transistor, a second transistor, a third transistor, a fourth transistor, a first capacitor, a second capacitor, and a display element,
wherein a gate of the first transistor and a gate of the second transistor are electrically connected to the same first wiring,
wherein one of a source and a drain of the first transistor is electrically connected to one electrode of the first capacitor and the display element,
wherein one of a source and a drain of the second transistor is electrically connected to the other electrode of the first capacitor and one of a source and a drain of the third transistor, and wherein a gate of the third transistor is electrically connected to one of a source and a drain of the fourth transistor and one electrode of the second capacitor.

2. The display device according to claim 1,
wherein the fourth transistor comprises a metal oxide in a channel formation region, and
wherein the metal oxide comprises In.

3. The display device according to claim 1,
wherein the other of the source and the drain of the second transistor is electrically connected to a first power supply line, and
wherein the other of the source and the drain of the third transistor is electrically connected to a second power supply line.

4. The display device according to claim 1, wherein the display element is a liquid crystal element.

5. The display device according to claim 1, wherein the display element is a light-emitting element.

6. The display device according to claim 1, wherein the other of the source and the drain of the first transistor is electrically connected to a second wiring.

7. The display device according to claim 1, wherein the other of the source and the drain of the fourth transistor is electrically connected to a third wiring.

8. The display device according to claim 1, wherein the other electrode of the second capacitor is electrically connected to a fourth wiring.

9. The display device according to claim 1, wherein a gate of the fourth transistor is electrically connected to a fifth wiring.

10. A display device comprising:
a first transistor, a second transistor, a third transistor, a fourth transistor, a first capacitor, a second capacitor, a display element, a fifth transistor, and a sixth transistor,
wherein one of a source and a drain of the first transistor is electrically connected to one electrode of the first capacitor,
wherein one of a source and a drain of the second transistor is electrically connected to the other electrode of the first capacitor and one of a source and a drain of the third transistor,
wherein a gate of the third transistor is electrically connected to one of a source and a drain of the fourth transistor and one electrode of the second capacitor,
wherein one of a source and a drain of the fifth transistor is electrically connected to the one of the source and the drain of the first transistor,
wherein the other of the source and the drain of the fifth transistor is electrically connected to the display element and one of a source and a drain of the sixth transistor, and
wherein the other of the source and the drain of the sixth transistor is electrically connected to a first power supply line.

11. The display device according to claim 10,
wherein the other of the source and the drain of the second transistor is electrically connected to a second power supply line, and
wherein the other of the source and the drain of the third transistor is electrically connected to a third power supply line.

12. The display device according to claim 10, wherein the display element is a liquid crystal element.

13. The display device according to claim 10, wherein the display element is a light-emitting element.

14. The display device according to claim 10,
wherein a gate of the first transistor and a gate of the second transistor are electrically connected to the same first wiring,
wherein the other of the source and the drain of the first transistor is electrically connected to a second wiring,
wherein the other of the source and the drain of the fourth transistor is electrically connected to a third wiring,
wherein the other electrode of the second capacitor is electrically connected to a fourth wiring, and
wherein a gate of the fourth transistor is electrically connected to a fifth wiring.

15. A display device comprising:
a first transistor, a second transistor, a third transistor, a fourth transistor, a first capacitor, a second capacitor, a display element, a fifth transistor, a sixth transistor, and a seventh transistor,
wherein a gate of the first transistor and a gate of the second transistor are electrically connected to the same first wiring,
wherein one of a source and a drain of the first transistor is electrically connected to one electrode of the first capacitor,
wherein one of a source and a drain of the second transistor is electrically connected to the other electrode of the first capacitor and one of a source and a drain of the third transistor,
wherein a gate of the third transistor is electrically connected to one of a source and a drain of the fourth transistor and one electrode of the second capacitor,
wherein one of a source and a drain of the fifth transistor is electrically connected to the one of the source and the drain of the first transistor,
wherein the other of the source and the drain of the fifth transistor is electrically connected to one of a source and a drain of the sixth transistor and a gate of the seventh transistor,
wherein the other of the source and the drain of the sixth transistor is electrically connected to a first power supply line, and
wherein one of a source and a drain of the seventh transistor is electrically connected to the display element.

16. The display device according to claim 15,
wherein the other of the source and the drain of the second transistor is electrically connected to a second power supply line, and
wherein the other of the source and the drain of the third transistor is electrically connected to a third power supply line.

17. The display device according to claim 15, wherein the display element is a liquid crystal element.

18. The display device according to claim 15, wherein the display element is a light-emitting element.

19. The display device according to claim 15,
wherein the other of the source and the drain of the first transistor is electrically connected to a second wiring,
wherein the other of the source and the drain of the fourth transistor is electrically connected to a third wiring,
wherein the other electrode of the second capacitor is electrically connected to a fourth wiring, and
wherein a gate of the fourth transistor is electrically connected to a fifth wiring.

* * * * *